(12) United States Patent
Ogasawara et al.

(10) Patent No.: US 9,455,231 B2
(45) Date of Patent: Sep. 27, 2016

(54) RESIN-SEALED SEMICONDUCTOR DEVICE AND METHOD OF MANUFACTURING THE SAME

(71) Applicant: SHINDENGEN ELECTRIC MANUFACTURING CO., LTD., Chiyoda-ku, Tokyo (JP)

(72) Inventors: Atsushi Ogasawara, Hanno (JP); Koji Ito, Hanno (JP); Kazuhiko Ito, Hanno (JP); Koya Muyari, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 14/370,960

(22) PCT Filed: Apr. 16, 2013

(86) PCT No.: PCT/JP2013/061332
§ 371 (c)(1),
(2) Date: Jul. 7, 2014

(87) PCT Pub. No.: WO2013/168521
PCT Pub. Date: Nov. 14, 2013

(65) Prior Publication Data
US 2014/0361446 A1    Dec. 11, 2014

(30) Foreign Application Priority Data

May 8, 2012  (JP) ..................... PCT/JP2012/061776

(51) Int. Cl.
*C03C 3/076*    (2006.01)
*B32B 17/00*    (2006.01)
(Continued)

(52) U.S. Cl.
CPC ............. *H01L 23/564* (2013.01); *C03C 3/085* (2013.01); *C03C 3/087* (2013.01); *C03C 3/093* (2013.01);
(Continued)

(58) Field of Classification Search
None
See application file for complete search history.

(56) References Cited

U.S. PATENT DOCUMENTS 3,355,291 A    11/1967    Baird et al.
3,392,312 A    7/1968    Carman
(Continued)

FOREIGN PATENT DOCUMENTS

CN    1893006 A    1/2007
JP    5526656 A    2/1980
(Continued)

OTHER PUBLICATIONS

Fluegel, Alexander. , "Thermal Expansion Calculation for Silicate Glasses at 210 C Based on a Systematic Analysis of Global Databases. " Glass Technology, v. 51, No. 5 (Oct. 2010), pp. 191-201, ill. 1753-3546.*
(Continued)

*Primary Examiner* — Calvin Choi
*Assistant Examiner* — Xiaoming Liu
(74) *Attorney, Agent, or Firm* — Hauptman Ham, LLP

(57) ABSTRACT

A resin-sealed semiconductor device includes a mesa-type semiconductor element which includes a mesa-type semiconductor base body having a pn junction exposure portion in an outer peripheral tapered region surrounding a mesa region, and a glass layer which covers at least the outer peripheral tapered region; and a molding resin which seals the mesa-type semiconductor element, wherein the glass layer is formed by forming a layer made of a predetermined glass composition for protecting a semiconductor junction which substantially contains no Pb such that the layer covers the outer peripheral tapered region and, subsequently, by baking the layer made of the glass composition for protecting a semiconductor junction.

12 Claims, 14 Drawing Sheets

(51) Int. Cl.
  *H01L 21/00* (2006.01)
  *H01L 23/00* (2006.01)
  *H01L 29/861* (2006.01)
  *H01L 29/66* (2006.01)
  *H01L 29/06* (2006.01)
  *H01L 23/31* (2006.01)
  *C03C 8/02* (2006.01)
  *C03C 8/04* (2006.01)
  *H01L 21/02* (2006.01)
  *H01L 23/29* (2006.01)
  *H01L 21/56* (2006.01)
  *C03C 3/085* (2006.01)
  *C03C 3/087* (2006.01)
  *C03C 3/093* (2006.01)
  *C03C 8/24* (2006.01)
  *H01L 23/495* (2006.01)

(52) U.S. Cl.
  CPC . *C03C 8/02* (2013.01); *C03C 8/04* (2013.01); *C03C 8/24* (2013.01); *H01L 21/02112* (2013.01); *H01L 21/02161* (2013.01); *H01L 21/02318* (2013.01); *H01L 21/56* (2013.01); *H01L 23/291* (2013.01); *H01L 23/3107* (2013.01); *H01L 23/3178* (2013.01); *H01L 29/0615* (2013.01); *H01L 29/0661* (2013.01); *H01L 29/66136* (2013.01); *H01L 29/861* (2013.01); *H01L 29/8613* (2013.01); *C03C 2207/00* (2013.01); *H01L 23/3171* (2013.01); *H01L 23/4952* (2013.01); *H01L 23/49551* (2013.01); *H01L 24/73* (2013.01); *H01L 2224/32245* (2013.01); *H01L 2224/45144* (2013.01); *H01L 2224/48091* (2013.01); *H01L 2224/48247* (2013.01); *H01L 2224/48472* (2013.01); *H01L 2224/73265* (2013.01); *H01L 2924/1301* (2013.01); *H01L 2924/1305* (2013.01); *H01L 2924/13055* (2013.01); *H01L 2924/13091* (2013.01)

(56) References Cited

U.S. PATENT DOCUMENTS

| | | | |
|---|---|---|---|
| 4,199,364 | A | 4/1980 | Neely |
| 5,047,369 | A * | 9/1991 | Fleming ............ H01L 21/02129 148/DIG. 133 |
| 5,298,330 | A * | 3/1994 | Stadnicar et al. ............ 428/432 |
| 5,882,986 | A | 3/1999 | Eng et al. |
| 9,006,113 | B2 | 4/2015 | Ogasawara et al. |
| 9,159,549 | B2 | 10/2015 | Ogasawara et al. |
| 2004/0018931 | A1 | 1/2004 | Sridharan et al. |
| 2007/0009744 | A1 | 1/2007 | Besinger et al. |
| 2007/0154713 | A1 | 7/2007 | Rosenflanz et al. |
| 2009/0109654 | A1* | 4/2009 | Fechner .................. C03C 3/068 362/97.1 |
| 2011/0028300 | A1 | 2/2011 | Zou et al. |
| 2011/0241043 | A1 | 10/2011 | Nakayama |
| 2012/0132282 | A1 | 5/2012 | Aitken et al. |

FOREIGN PATENT DOCUMENTS

| | | | |
|---|---|---|---|
| JP | 57202742 A | | 12/1982 |
| JP | 1186629 A | | 7/1989 |
| JP | 10116828 A | * | 5/1998 |
| JP | 10294473 A | * | 11/1998 |
| JP | 200487955 A | | 3/2004 |
| JP | 2005-525287 A | | 8/2005 |
| JP | 2011-60857 A | | 3/2011 |
| WO | 2012/160962 A1 | | 11/2012 |

OTHER PUBLICATIONS

International Search Report mailed Jul. 9, 2013, corresponds to PCT/JP2013/061332.

Extended European Search Report in EP Application No. 12876406.5, dated Jan. 7, 2016.

* cited by examiner

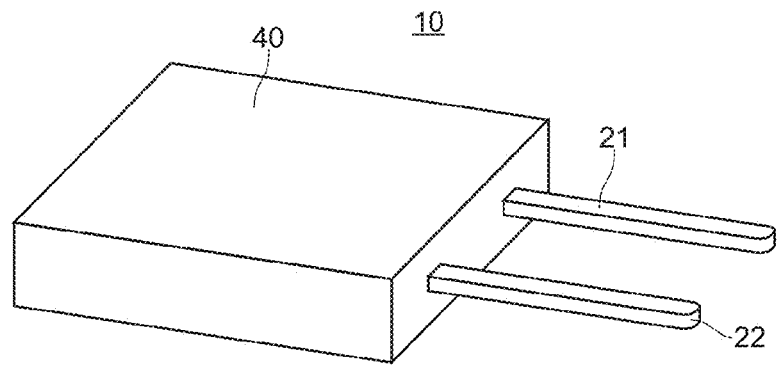
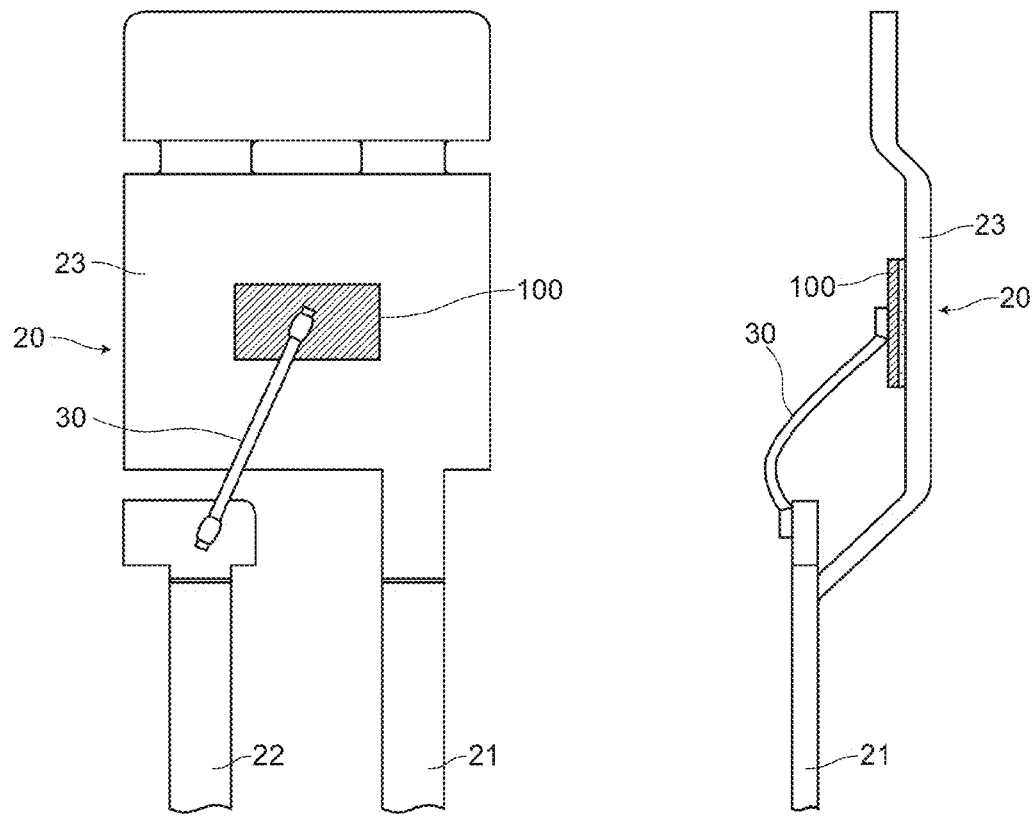
FIG.1A
FIG.1B    FIG.1C

| item | | | example 1 | example 2 | example 3 | example 4 | example 5 | example 6 | example 7 | example 8 | comparison example 1 | comparison example 2 | comparison example 3 | comparison example 4 |
|---|---|---|---|---|---|---|---|---|---|---|---|---|---|---|
| composition ratio (mol ratio) | | $SiO_2$ | 61.2 | 52.5 | 57.2 | 58.3 | 58.3 | 58.3 | 58.9 | 55.3 | 75.0 | 12.0 | 57.2 | 76.0 |
| | | $Al_2O_3$ | 14.0 | 14.0 | 14.1 | 12.0 | 14.0 | 14.0 | 13.7 | 13.8 | 5.0 | 0 | 14.1 | 1.5 |
| | | $B_2O_3$ | 8.8 | 17.5 | 13.9 | 11.7 | 11.7 | 11.7 | 8.8 | 13.5 | 0 | 29.0 | 13.9 | 19.0 |
| | | ZnO | 8.0 | 8.0 | 4.6 | 9.0 | 8.0 | 8.0 | 7.8 | 4.5 | 0 | 58.0 | 4.6 | 0 |
| | alkaline earth metal | CaO | 2.4 | 2.4 | 6.1 | 2.7 | 2.4 | 4.0 | 4.9 | 7.3 | 0 | 0 | 6.1 | 0.6 |
| | | BaO | 5.6 | 3.4 | 4.1 | 5.0 | 4.5 | 4.0 | 2.9 | 5.0 | 0 | 0 | 4.1 | 0 |
| | | MgO | 0 | 2.2 | 0 | 1.3 | 1.1 | 0 | 2.0 | 0 | 0 | 0 | 0 | 0 |
| | | NiO | 0 | 0 | 0 | 0 | 0 | 0 | 0 | 0.6 | 0 | 0 | 0 | 0 |
| | | $ZrO_2$ | 0 | 0 | 0 | 0 | 0 | 0 | 1.0 | 0 | 0 | 0 | 0 | 0.9 |
| | | PbO | 0 | 0 | 0 | 0 | 0 | 0 | 0 | 0 | 20.0 | 0 | 0 | 0 |
| | | $K_2O$ | 0 | 0 | 0 | 0 | 0 | 0 | 0 | 0 | 0 | 0 | 0 | 1.0 |
| | | $Na_2O$ | 0 | 0 | 0 | 0 | 0 | 0 | 0 | 0 | 0 | 1.0 | 0 | 1.0 |
| | | other components | 0 | 0 | 0 | 0 | 0 | 0 | 0 | 0 | 0 | 0 | 0 | 0 |
| | | total | 100.0 | 100.0 | 100.0 | 100.0 | 100.0 | 100.0 | 100.0 | 100.0 | 100.0 | 100.0 | 100.0 | 100.0 |
| | filler | | contains no filler | contains no filler | contains no filler | contains no filler | contains no filler | contains no filler | contains no filler | contains no filler | contains no filler | contains no filler | contains no filler | contains no filler |
| | insulation layer | | present | present | present | present | present | present | not present | not present | not present | not present | not present | not present |
| evaluation aspect | 1. environmental burden | | good | good | good | good | good | good | good | good | bad | good | good | good |
| | 2. baking temperature | | good | good | good | good | good | good | good | good | good | good | good | good |
| | 3. resistance to chemicals | | good | good | good | good | good | good | good | good | good | bad | good | good |
| | 4. average linear expansion coefficient | | good (3.82) | good (3.78) | good (3.75) | good (3.65) | good (3.52) | good (3.41) | good (3.90) | good (3.97) | bad (4.2) | bad (4.2) | good (3.7) | bad (2.5) |
| | 5. presence or non-presence of crystallization | | good | good | good | good | good | good | good | good | good | good | good | good |
| | 6. presence or non-presence of generation of bubbles | | good | good | good | good | good | good | good | good | good | good | × | good |
| | 7. reverse leakage current | | good | good | good | good | good | good | good | good | good | good | – | – |
| | 8. resistance to reverse bias at high temperature | | good | – | – | – | good | – | – | good | bad | good | – | bad |
| | 9. presence or non-presence of diffusion of B | | good | good | good | good | good | good | good | good | bad | bad | bad | bad |
| comprehensive evaluation | | | good | good | good | good | good | good | good | good | bad | bad | bad | bad |

FIG. 9

|  | L1 | L2 | L3 | L4 | L5 | L5 | L6 | L7 | L8 |
|---|---|---|---|---|---|---|---|---|---|
| SiO$_2$ | 37.50 | 37.50 | 37.50 | 41.70 | 41.70 | 41.70 | 43.70 | 43.70 | 43.70 |
| B$_2$O$_3$ | 12.50 | 12.50 | 12.50 | 8.30 | 8.30 | 8.30 | 6.30 | 6.30 | 6.30 |
| Al$_2$O$_3$ | 10.00 | 12.00 | 14.00 | 10.00 | 12.00 | 14.00 | 10.00 | 12.00 | 14.00 |
| ZnO | 12.00 | 19.00 | 25.20 | 12.00 | 19.00 | 25.20 | 20.00 | 26.60 | 10.80 |
| CaO | 8.40 | 9.50 | 7.56 | 14.00 | 13.30 | 3.24 | 14.00 | 3.42 | 12.60 |
| MgO | 7.84 | 1.90 | – | – | 2.28 | 1.51 | 1.20 | – | 5.04 |
| BaO | 11.76 | 7.60 | 3.24 | 14.00 | 3.42 | 6.05 | 4.80 | 7.98 | 7.56 |
| SUM | 100 | 100 | 100 | 100 | 100 | 100 | 100 | 100 | 100 |
| total RO | 28.00 | 19.00 | 10.80 | 28.00 | 19.00 | 10.80 | 20.00 | 11.40 | 25.20 |
| crystallization | good | good | good | good | good | good | good | good | good |
| α (50-550) [ppm] | 6.70 | 5.97 | 4.74 | 7.22 | 5.88 | 5.17 | 5.79 | 4.98 | 6.09 |
| Tg[°C] | 647.9 | 632.0 | 650.6 | 666.7 | 666.0 | 665.2 | 668.2 | 671.7 | 691.9 |
| Ts[°C] | 719.6 | 707.4 | 717.4 | 730.8 | 742.5 | 732.0 | 724.8 | 742.6 | 764.4 |

|  | L10 | L11 | L12 | L13 | L14 | L15 | L16 | L17 | L18 |
|---|---|---|---|---|---|---|---|---|---|
| SiO$_2$ | 52.50 | 52.50 | 52.50 | 58.30 | 58.30 | 58.30 | 61.25 | 61.25 | 61.25 |
| B$_2$O$_3$ | 17.50 | 17.50 | 17.50 | 11.70 | 11.70 | 11.70 | 8.75 | 8.75 | 8.75 |
| Al$_2$O$_3$ | 10.00 | 12.00 | 14.00 | 10.00 | 12.00 | 14.00 | 10.00 | 12.00 | 14.00 |
| ZnO | 14.00 | 5.40 | 8.00 | 10.00 | 12.60 | 4.80 | 14.00 | 5.40 | 8.00 |
| CaO | 3.00 | 8.82 | 2.40 | 3.00 | 2.70 | 7.84 | 4.20 | 3.78 | 4.00 |
| MgO | 0.60 | – | 2.24 | – | 1.08 | 0.67 | 0.72 | 1.76 | 0.00 |
| BaO | 2.40 | 3.78 | 3.36 | 7.00 | 1.62 | 2.69 | 1.08 | 7.06 | 4.00 |
| SUM | 100 | 100 | 100 | 100 | 100 | 100 | 100 | 100 | 100 |
| total RO | 6.00 | 12.60 | 8.00 | 10.00 | 5.40 | 11.20 | 6.00 | 12.60 | 8.00 |
| crystallization | bad | good | good | good | bad | good | bad | good | good |
| α (50-550) [ppm] | 3.85 | 4.68 | 3.78 | 4.42 | 3.47 | 4.12 | 3.16 | 4.51 | 3.41 |
| Tg[°C] | 649.1 | 673.9 | 686.4 | 674.7 | 689.9 | 725.1 | 692.3 | 717.5 | 703.0 |
| Ts[°C] | 740.3 | 757.5 | 774.6 | 762.5 | 824.6 | 815.0 | 865.8 | 810.8 | 791.8 |

FIG.16

RESIN-SEALED SEMICONDUCTOR DEVICE AND METHOD OF MANUFACTURING THE SAME

RELATED APPLICATIONS

The present application is a National Phase of International Application Number PCT/JP2013/061332, filed Apr. 16, 2013, which claims priority from International Application Number PCT/JP2012/061776, filed May 8, 2012.

TECHNICAL FIELD

The present invention relates to a resin-sealed semiconductor device and a method of manufacturing the resin-sealed semiconductor device.

BACKGROUND ART

There has been known a mesa-type semiconductor element having the structure where a pn junction is exposed on an outer peripheral tapered region which surrounds a mesa region (see patent literatures 1 and 2, for example). FIG. 18 is a view provided for explaining a conventional mesa-type semiconductor element 900.

The conventional mesa-type semiconductor element 900 includes, as shown in FIG. 18, a mesa-type semiconductor base body 908 having a pn junction exposure portion C in an outer peripheral tapered region B surrounding a mesa region A, and a glass layer 924 which covers at least the outer peripheral tapered region B. The glass layer 924 is a glass layer for passivation made of "a glass material containing lead silicate as a main component". In FIG. 18, symbol 910 indicates an n$^-$-type semiconductor layer, symbol 912 indicates a p$^-$-type semiconductor layer, symbol 914 indicates an n$^+$-type semiconductor layer, symbol 916a indicates a silicon oxide film, symbol 934 indicates an anode electrode layer, and symbol 936 indicates a cathode electrode layer.

PRIOR ART LITERATURE

Patent Literature

Patent literature 1: JP-A-10-116828
Patent literature 2: JP-A-2004-87955

SUMMARY OF THE INVENTION

Technical Problem

However, through studies made by inventors of the present invention, it has been clearly found that the conventional mesa-type semiconductor element 900 has a drawback that, in a resin-sealed semiconductor device manufactured by molding the mesa-type semiconductor element 900 with a resin (a conventional resin-sealed semiconductor device), resistance to a reverse bias at a high temperature which the mesa-type semiconductor element 900 has is lowered.

The present invention has been made to overcome the above-mentioned drawbacks, and it is an object of the present invention to provide a resin-sealed semiconductor device which is manufactured by molding a mesa-type semiconductor element with a resin and has higher resistance to a reverse bias at a high temperature than a conventional resin-sealed semiconductor device.

It is another object of the present invention to provide a method of manufacturing a resin-sealed semiconductor device by which such a resin-sealed semiconductor device can be manufactured.

Solution to Problem

The inventors of the present invention have extensively studied a cause which lowers resistance to a reverse bias at a high temperature when a resin-sealed semiconductor device is manufactured by molding a conventional mesa-type semiconductor element with a resin. As a result of the studies, the inventors have made the following finding as the cause of the lowering of resistance to a reverse bias at a high temperature. That is, lead-containing glass which constitutes a glass layer has a high dielectric constant and hence, large polarization is generated in the glass layer (see FIG. 3B described later). As a result, ions of high concentration are induced on an interface between a molded resin and the glass layer as well as on an interface between the glass layer and the semiconductor layer in the midst of performing a high-temperature reverse bias test. A channel formed of an inverted layer is formed on the interface between the glass layer and the semiconductor layer by being influenced by the induced ions and hence, a leakage current is increased.

In view of the above, based on such finding, the inventors of the present invention have arrived at an idea that, with the use of a glass layer made of lead-free glass (glass which contains no oxide of Pb) having a lower dielectric constant than lead-containing glass as a glass layer, ions of high concentration are hardly induced on an interface between a molded resin and a glass layer as well as on an interface between the glass layer and a semiconductor layer in the midst of performing a high-temperature reverse bias test (see FIG. 3A described later) and hence, as a result, a leakage current which is increased during the high-temperature reverse bias test can be decreased compared to the prior art, and have completed the present invention.

[1] According to one aspect of the present invention, there is provided a resin-sealed semiconductor device which includes:

a mesa-type semiconductor element which includes a mesa-type semiconductor base body having a pn-junction exposure portion in an outer peripheral tapered region which surrounds a mesa region, and a glass layer which covers at least the outer peripheral tapered region; and a molding resin which seals the mesa-type semiconductor element, wherein the glass layer is formed by forming a layer made of a glass composition for protecting a semiconductor junction such that the layer covers the outer peripheral tapered region and, subsequently, by baking the layer made of the glass composition for protecting a semiconductor junction, wherein the glass composition for protecting a semiconductor junction is made of fine glass particles prepared from a material in a molten state obtained by melting a raw material which contains at least $SiO_2$, $Al_2O_3$, $B_2O_3$, ZnO and at least two oxides of alkaline earth metals selected from a group consisting of CaO, BaO and MgO, contents of the respective components being set as described below, substantially contains none of Pb, As, Sb, Li, Na and K, and contains none of the components of the raw material as a filler.

the content of $SiO_2$: 49.5 mol % to 64.3 mol %
the content of $Al_2O_3$: 3.7 mol % to 14.8 mol %
the content of $B_2O_3$: 8.4 mol % to 17.9 mol %
the content of ZnO: 3.9 mol % to 14.2 mol % the content of oxides of alkaline earth metals, 7.4 mol % to 12.9 mol %

[2] In the resin-sealed semiconductor device according to the present invention, it is preferable that the glass composition for protecting a semiconductor junction is a glass composition for protecting a semiconductor junction where an average linear expansion coefficient within a temperature range of 50° C. to 550° C. of the glass composition for protecting a semiconductor junction falls within a range of $3.33 \times 10^{-6}$ to $4.13 \times 10^{-6}$.

[3] In the resin-sealed semiconductor device according to the present invention, it is preferable that the glass composition for protecting a semiconductor junction is a glass composition for protecting a semiconductor junction where a total content of the content of $SiO_2$ and the content of $B_2O_3$ falls within a range of 65 mol % to 75 mol %.

[4] In the resin-sealed semiconductor device according to the present invention, it is preferable that the raw material substantially contains no P.

[5] In the resin-sealed semiconductor device according to the present invention, it is preferable that the raw material substantially contains no Bi.

[6] In the resin-sealed semiconductor device according to the present invention, it is preferable that the glass layer is formed by baking a layer made of the glass composition for protecting a semiconductor junction at a temperature of 900° C. or below.

[7] In the resin-sealed semiconductor device according to the present invention, it is preferable that the outer peripheral tapered region is directly covered with the glass layer.

[8] In the resin-sealed semiconductor device according to the present invention, it is preferable that the outer peripheral tapered region is covered with the glass layer with an insulation layer interposed between the outer peripheral tapered region and the glass layer.

[9] In the resin-sealed semiconductor device according to the present invention, it is preferable that the glass composition for protecting a semiconductor junction is a glass composition for protecting a semiconductor junction which substantially contains no multivalent element as a defoaming agent.

[10] In the resin-sealed semiconductor device according to the present invention, it is preferable that the multivalent element contains V, Mn, Sn, Ce, Nb and Ta.

[11] According to another aspect of the present invention, there is provided a method of manufacturing a resin-sealed semiconductor device, the method includes, in the following order, the steps of:

preparing a semiconductor substrate provided with a pn-junction parallel to a main surface;

forming a trench from one surface of the semiconductor substrate with a depth exceeding the pn junction;

forming a glass layer by forming a layer made of a glass composition for protecting a semiconductor junction such that the layer covers at least an inner surface of the trench and, subsequently, by baking the layer made of the glass composition for protecting a semiconductor junction;

preparing mesa-type semiconductor elements by cutting the semiconductor substrate along the trench; and sealing the mesa-type semiconductor element with a molding resin, wherein the glass composition for protecting a semiconductor junction is made of fine glass particles prepared from a material in a molten state obtained by melting a raw material which contains at least $SiO_2$, $Al_2O_3$, $B_2O_3$, ZnO and at least two oxides of alkaline earth metals selected from a group consisting of CaO, BaO and MgO, the contents of the respective components being set as described below, and substantially contains none of Pb, As, Sb, Li, Na and K, and contains none of the components of the raw material as a filler.

the content of $SiO_2$: 49.5 mol % to 64.3 mol %
the content of $Al_2O_3$: 3.7 mol % to 14.8 mol %
the content of $B_2O_3$: 8.4 mol % to 17.9 mol %
the content of ZnO: 3.9 mol % to 14.2 mol %
the content of oxides of alkaline earth metals, 7.4 mol % to 12.9 mol %

It is preferable that the method of manufacturing a resin-sealed semiconductor device according to the present invention has the following technical features [12] to [20] in the same manner as the resin-sealed semiconductor device according to the present invention.

[12] In the method of manufacturing a resin-sealed semiconductor device according to the present invention, it is preferable that the glass composition for protecting a semiconductor junction is a glass composition for protecting a semiconductor junction where an average linear expansion coefficient within a temperature range of 50° C. to 550° C. of the glass composition for protecting a semiconductor junction falls within a range of $3.33 \times 10^{-6}$ to $4.13 \times 10^{-6}$.

[13] In the method of manufacturing a resin-sealed semiconductor device according to the present invention, it is preferable that the glass composition for protecting a semiconductor junction is a glass composition for protecting a semiconductor junction where a total content of the content of $SiO_2$ and the content of $B_2O_3$ falls within a range of 65 mol % to 75 mol %.

[14] In the method of manufacturing a resin-sealed semiconductor device according to the present invention, it is preferable that the raw material substantially contains no P.

[15] In the method of manufacturing a resin-sealed semiconductor device according to the present invention, it is preferable that the raw material substantially contains no Bi.

[16] In the method of manufacturing a resin-sealed semiconductor device according to the present invention, it is preferable that the glass layer is formed by baking a layer made of the glass composition for protecting a semiconductor junction at a temperature of 900° C. or below.

[17] In the method of manufacturing a resin-sealed semiconductor device according to the present invention, it is preferable that the outer peripheral tapered region is directly covered with the glass layer.

[18] In the method of manufacturing a resin-sealed semiconductor device according to the present invention, it is preferable that the outer peripheral tapered region is covered with the glass layer with an insulation layer interposed between the outer peripheral tapered region and the glass layer.

[19] In the method of manufacturing a resin-sealed semiconductor device according to the present invention, it is preferable that the glass composition for protecting a semiconductor junction is a glass composition for protecting a semiconductor junction which substantially contains no multivalent element as a defoaming agent.

[20] In the method of manufacturing a resin-sealed semiconductor device according to the present invention, it is preferable that the multivalent element contains V, Mn, Sn, Ce, Nb and Ta.

In the present invention, "to contain at least some specific components ($SiO_2$, $Al_2O_3$, $B_2O_3$ and the like)" means not only the case where the glass composition contains only such specific components but also the case where the glass composition also contains other components which can be usually contained in the glass composition besides such specific components.

In the present invention, "to substantially contain no specific element (Pb, As, Sb or the like)" means that the glass composition contains no any such specific element as the component, and does not exclude the glass composition in which the above-mentioned specific element is mixed as an impurity in the raw materials which constitute respective components of glass.

In the present invention, "to contain no specific element (Pb, As, Sb or the like)" means that the glass composition contains no oxide of the specific element, no nitride of the specific element or the like.

In the present invention, "to contain none of the specific components in the raw material as a filler" means that, when the component is $SiO_2$, for example, the glass composition does not contain $SiO_2$ in the form of an embedded material, a packed material, a filling material, an adding material or the like made of $SiO_2$ fine particles.

Advantage of the Invention

According to the resin-sealed semiconductor device of the present invention, the mesa-type semiconductor element includes a glass layer made of lead-free glass (glass which contains no Pb) having a lower dielectric constant than lead-containing glass as the glass layer thereof and hence, ions of high concentration are hardly induced on an interface between a molded resin and the glass layer as well as on an interface between the glass layer and a semiconductor layer in the midst of performing a high-temperature reverse bias test (see FIG. 3 described later). As a result, a leakage current which is increased during the high-temperature reverse bias test can be decreased compared to the prior art. Accordingly, the resin-sealed semiconductor device of the present invention can acquire higher resistance to a reverse bias at a high temperature than a conventional resin-sealed semiconductor device which is manufactured by molding a semiconductor device prepared by using "a glass material containing lead silicate as a main component" with a resin.

As a result, the resin-sealed semiconductor device of the present invention and the resin-sealed semiconductor device manufactured by the method of manufacturing a resin-sealed semiconductor device of the present invention can acquire higher resistance to a reverse bias at a high temperature than the conventional resin-sealed semiconductor device, although the resin-sealed semiconductor device of the present invention and the resin-sealed semiconductor device manufactured by the method of manufacturing a resin-sealed semiconductor device of the present invention have the structure where the mesa-type semiconductor element is molded with a resin in the same manner as the conventional resin-sealed semiconductor device. That is, the resin-sealed semiconductor device of the present invention is the resin-sealed semiconductor device having higher resistance to a reverse bias at a high temperature than the conventional resin-sealed semiconductor device while being the resin-sealed semiconductor device which is manufactured by molding the mesa-type semiconductor element with a resin.

To increase resistance to a reverse bias at a high temperature of the resin-sealed semiconductor device, it is also considered to adopt (1) a method of forming a trench having a large width (mesa trench) in a step of manufacturing a mesa-type semiconductor element, (2) a method of forming a deep trench (mesa trench) using a diffusion wafer in a step of manufacturing a mesa-type semiconductor element, (3) a method using a wafer having low specific resistance, and (4) a method of forming a glass layer having a large thickness. However, the above-mentioned method (1) has a drawback that a manufacturing cost of a product is pushed up due to the increase of an area of a chip. The above-mentioned method (2) has a drawback that a cost of a wafer is pushed up with the use of a diffusion wafer, and a drawback that a manufacturing cost of a product is pushed up due to a difficult step of forming a deep trench. The above-mentioned method (3) has a drawback that it is difficult to ensure a reverse withstand voltage. The above-mentioned method (4) has a drawback that warping or cracks occur in a wafer during a step. The resin-sealed semiconductor device of the present invention can obviate the above-mentioned drawbacks, and can increase resistance to a reverse bias at a high temperature.

According to the resin-sealed semiconductor device and the method of manufacturing the resin-sealed semiconductor device of the present invention, the glass layer is formed by baking the layer made of the glass composition for protecting a semiconductor junction which is made of fine glass particles prepared from a material in a molten state obtained by melting a raw material which contains at least $SiO_2$, $Al_2O_3$, $B_2O_3$, ZnO, at least two oxides of alkaline earth metals selected from a group consisting of CaO, BaO and MgO, contents of the respective components being set as described above. Accordingly, as can be clearly understood from an example (evaluation aspect 4) described later, it is possible to set an average linear expansion coefficient within a temperature range of 50° C. to 550° C. to a linear expansion coefficient (for example, $3.33 \times 10^{-6}$ to $4.13 \times 10^{-6}$) close to a linear expansion coefficient of silicon. Accordingly, warping of a wafer in a step can be made extremely small and hence, a resin-sealed semiconductor device having an excellent forward breakdown voltage characteristic can be manufactured using a thin wafer and, at the same time, a resin-sealed semiconductor device having an excellent reverse breakdown voltage characteristic can be manufactured by increasing a thickness of the glass layer.

According to the resin-sealed semiconductor device and the method of manufacturing the resin-sealed semiconductor device of the present invention, the glass layer is formed by baking the layer made of the glass composition for protecting a semiconductor junction which is made of fine glass particles prepared from a material in a molten state obtained by melting a raw material which contains at least $SiO_2$, $Al_2O_3$, $B_2O_3$, ZnO, at least two oxides of alkaline earth metals selected from a group consisting of CaO, BaO and MgO, contents of the respective components being set as described above. Accordingly, as can be clearly understood from an example (evaluation aspect 2) described later, the glass layer can be baked at a relatively low temperature and hence, crystallization of the glass layer is hardly generated in the step of baking the glass layer. Also because of such an advantageous effect, a resin-sealed semiconductor device having a low reverse leakage current and eventually having high resistance to a reverse bias at a high temperature can be manufactured in a stable manner.

When the glass composition for protecting a semiconductor junction containing a filler is used as the glass composition for protecting a semiconductor junction in a step of manufacturing a resin-sealed semiconductor device, there may be a case where it is difficult to form the uniform layer made of the glass composition for protecting a semiconductor junction at the time of forming the layer made of the glass composition for protecting a semiconductor junction such that the layer covers an inner surface of the trench. That is, when the layer made of the glass composition for protecting a semiconductor junction is formed by an electrophoresis method, it is difficult to form the uniform layer made of the glass composition for protecting a semiconductor junction due to non-uniformity of electrophoresis. On the other hand, when the layer made of the glass composition for protecting a semiconductor junction is formed by a spin coating method, a screen printing method or a doctor blade method, there may be a case where it is difficult to form the uniform layer made of the glass composition for protecting a semiconductor junction due to the difference in particle size or specific gravity.

To the contrary, according to the resin-sealed semiconductor device and the method of manufacturing the resin-sealed semiconductor device of the present invention, as the glass composition for protecting a semiconductor junction, the layer is used where the layer is made of the glass composition for protecting a semiconductor junction containing none of components of the raw material as a filler. Accordingly, the layer made of the glass composition for protecting a semiconductor junction can be uniformly formed at the time of forming the layer made of the glass composition for protecting a semiconductor junction such that the layer covers the inner surface of the trench.

Further, according to the resin-sealed semiconductor device and the method of manufacturing the resin-sealed semiconductor device of the present invention, the glass composition which substantially contains none of Li, Na and K is used. Accordingly, as can be clearly understood from an example (evaluation aspect 9) described later, even when B (boron) is contained in the glass composition, for example, there is no possibility that B (boron) diffuses into silicon from the glass layer during baking of the glass composition and hence, a highly reliable resin-sealed semiconductor device can be manufactured.

According to the method of manufacturing a resin-sealed semiconductor device of the present invention, an excellent resin-sealed semiconductor device having high resistance to a reverse bias at a high temperature as described above can be manufactured.

BRIEF DESCRIPTION OF THE DRAWINGS

FIG. 1A to FIG. 1C are views for explaining a resin-sealed semiconductor device of an embodiment 1.

FIG. 9 is a table showing conditions and results of examples.

FIG. 16 is a Table showing the compositions and the results of experiments with respect to 18 levels.

MODE FOR CARRYING OUT THE INVENTION

Figure 2:
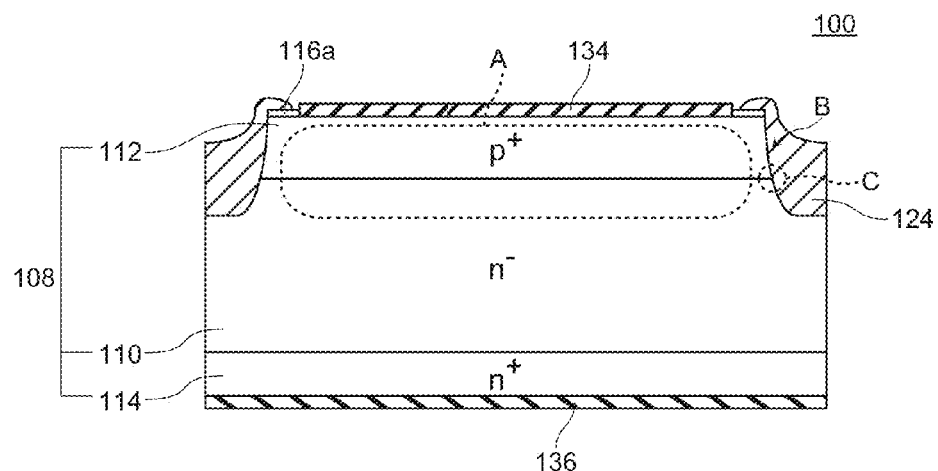
FIG. 2 is a view for explaining a mesa-type semiconductor element of the embodiment 1.

Hereinafter, a resin-sealed semiconductor device, and a method of manufacturing the resin-sealed semiconductor device according to the present invention are explained in conjunction with embodiments shown in the drawings.

Embodiment 1

1. Resin-Sealed Semiconductor Device

FIG. 1A to FIG. 1C are views for explaining a resin-sealed semiconductor device 10 of an embodiment 1. FIG. 1A is a perspective view of the resin-sealed semiconductor device 10, FIG. 1B is a plan view of the resin-sealed semiconductor device 10 in a state where a resin is removed from the resin-sealed semiconductor device 10, and FIG. 1C is a side view of the resin-sealed semiconductor device 10 in a state where a resin is removed from the resin-sealed semiconductor device 10.

FIG. 2 is a view for explaining a mesa-type semiconductor element 100 of the embodiment 1.

The resin-sealed semiconductor device 10 of the embodiment 1 includes, as shown in FIG. 1, the mesa-type semiconductor element 100, and a molding resin 40 which seals the mesa-type semiconductor element 100. The mesa-type semiconductor element 100 is mounted on a die pad 23 of a lead frame 20 which is constituted of a lead 21, a lead 22 and the die pad 23. One electrode of the mesa-type semiconductor element 100 is connected to the lead 21 via the die pad 23, and the other electrode of the mesa-type semiconductor element 100 is connected to the lead 22 via an Al wire 30.

As shown in FIG. 2, the mesa-type semiconductor element 100 includes a mesa-type semiconductor base body 108 having a pn-junction exposure portion C in an outer peripheral tapered region B which surrounds a mesa region A, and a glass layer 124 which covers at least the outer peripheral tapered region B. The outer peripheral tapered region B is directly covered with the glass layer 124.

The mesa-type semiconductor base body 108 includes an $n^-$-type semiconductor layer 110, a $p^+$-type semiconductor layer 112 which is formed by diffusion of a p-type impurity from one surface of the $n^-$-type semiconductor layer 110, and an $n^+$-type semiconductor layer 114 which is formed by diffusion of an n-type impurity from the other surface of the n⁻-type semiconductor layer 110. The mesa-type semiconductor element 100 is a pn diode. In FIG. 2, symbol 134 indicates an anode electrode layer, and symbol 136 indicates a cathode electrode layer.

The resin-sealed semiconductor device 10 of the embodiment 1 is characterized in that the mesa-type semiconductor element 100 includes a glass layer which substantially contains no Pb as the glass layer 124. As such a glass layer, preferably used is a glass layer which is formed by forming a layer made of a glass composition for protecting a semiconductor junction such that the layer covers the outer peripheral tapered region and, subsequently, by baking the layer made of the glass composition for protecting a semiconductor junction.

The resin-sealed semiconductor device 10 of the embodiment 1, as such a glass composition for protecting a semiconductor junction, uses a glass composition for protecting a semiconductor junction which is made of fine glass particles prepared from a material in a molten state obtained by melting a raw material which contains at least $SiO_2$, $Al_2O_3$, $B_2O_3$, ZnO and at least two oxides of alkaline earth metals selected from a group consisting of CaO, BaO and MgO, contents of the respective components being set as described below, substantially contains none of Pb, As, Sb, Li, Na and K, and contains none of the components of the raw material as a filler.

the content of $SiO_2$: 49.5 mol % to 64.3 mol %
the content of $Al_2O_2$: 3.7 mol % to 14.8 mol %
the content of $B_2O_3$: 8.4 mol % to 17.9 mol %
the content of ZnO: 3.9 mol % to 14.2 mol %
the content of oxides of alkaline earth metals, 7.4 mol % to 12.9 mol %

As such a glass composition for protecting a semiconductor junction, it is preferable to use a glass composition for protecting a semiconductor junction where an average linear expansion coefficient within a temperature range of 50° C. to 550° C. of the glass composition for protecting a semiconductor junction falls within a range of $3.33 \times 10^{-6}$ to $4.13 \times 10^{-6}$, and it is more preferable to use a glass composition for protecting a semiconductor junction where an average linear expansion coefficient within a temperature range of 50° C. to 550° C. of the glass composition for protecting a semiconductor junction falls within a range of $3.38 \times 10^{-6}$ to $4.08 \times 10^{-6}$.

As such a glass composition for protecting a semiconductor junction, it is preferable to use a glass composition for protecting a semiconductor junction where a total content of the content of $SiO_2$ and the content of $B_2O_3$ falls within a range of 65 mol % to 75 mol %.

It is preferable that the raw material substantially contains no P.

It is also preferable that the raw material substantially contains no Bi.

It is preferable that the glass layer is a glass layer which is formed by baking a layer made of the glass composition for protecting a semiconductor junction at a temperature of 900° C. or below.

In the latter case, as the glass composition for protecting a semiconductor junction, it is preferable to use a glass composition for protecting a semiconductor junction which substantially contains no multivalent element (for example, V, Mn, Sn, Ce, Nb or Ta) as a defoaming agent.

When the glass composition for protecting a semiconductor junction contains all of CaO, BaO and MgO as oxides of alkaline earth metals, it is preferable that the content of CaO is set to a value which falls within a range of 2.0 mol % to 5.3 mol %, the content of BaO is set to a value which falls within a range of 2.6 mol % to 5.3 mol %, and the content of MgO is set to a value which falls within a range of 1.0 mol % to 2.3 mol %.

When the glass composition for protecting a semiconductor junction contains only CaO and BaO as oxides of alkaline earth metals out of CaO, BaO and MgO, it is preferable that the content of CaO is set to a value which falls within a range of 2.0 mol % to 7.6 mol %, and the content of BaO is set to a value which falls within a range of 3.7 mol % to 5.9 mol %.

As the glass composition for protecting a semiconductor junction, a glass composition for protecting a semiconductor junction which further contains at least one metal oxide selected from a group consisting of nickel oxide, copper oxide, manganese oxide and zirconium oxide may be used.

In this case, it is preferable that the content of at least one metal oxide selected from a group consisting of nickel oxide, copper oxide, manganese oxide and zirconium oxide is set to a value which falls within a range of 0.01 mol % to 2.0 mol %.

2. Advantageous Effect of Resin-Sealed Semiconductor Device

Figure 3A:
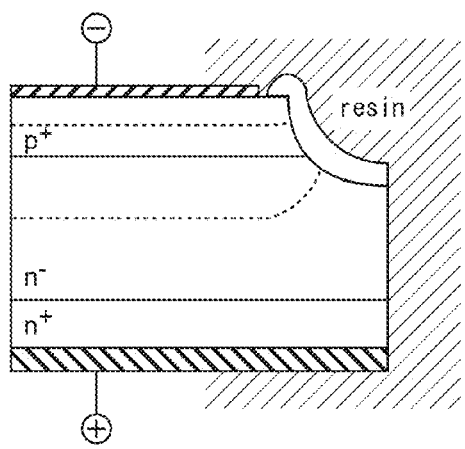
FIG. 3A and FIG. 3B are views for explaining an advantageous effect of the resin-sealed semiconductor device of the embodiment 1.
Figure 3B:
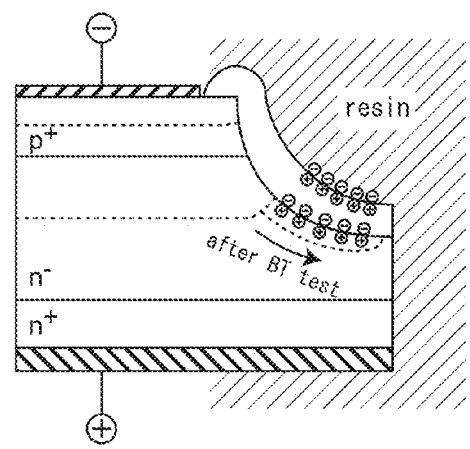

FIG. 3A and FIG. 3B are views for explaining an advantageous effect of the resin-sealed semiconductor device 10 of the embodiment 1. FIG. 3A is a view showing a state where a reverse voltage is applied to the resin-sealed semiconductor device 10 of the embodiment 1, and FIG. 3B is a view showing a state where a reverse voltage is applied to a resin-sealed semiconductor device of a comparison example. In FIG. 3A and FIG. 3B, a broken line indicates a distal end portion of a depletion layer. The resin-sealed semiconductor device of the comparison example is a resin-sealed semiconductor device formed by molding a conventional mesa-type semiconductor element 900 with a resin. In FIG. 3B, "AFTER BT TEST" means "after a high-temperature reverse bias test".

According to the resin-sealed semiconductor device 10 of the embodiment 1, the mesa-type semiconductor element 100 includes a glass layer made of lead-free glass (glass which contains no Pb) having a lower dielectric constant than lead-containing glass as the glass layer 124 and hence, ions of high concentration are hardly induced on an interface between a molded resin and the glass layer as well as on an interface between the glass layer and a semiconductor layer in the midst of performing a high-temperature reverse bias test (see FIG. 3A) different from the case of the resin-sealed semiconductor device of the comparison example (see FIG. 3B). As a result, an amount of a leakage current which is increased during the high-temperature reverse bias test can be decreased compared to the prior art. Accordingly, the resin-sealed semiconductor device of this embodiment can acquire higher resistance to a reverse bias at a high temperature than the conventional resin-sealed semiconductor device which is manufactured by molding a semiconductor device prepared by using "a glass material containing lead silicate as a main component" with a resin.

As a result, the resin-sealed semiconductor device 10 of the embodiment 1 can acquire higher resistance to a reverse bias at a high temperature than the conventional resin-sealed semiconductor device, although the resin-sealed semiconductor device 10 of the embodiment 1 has the structure where the mesa-type semiconductor element is molded with a resin in the same manner as the conventional resin-sealed semiconductor device. That is, the resin-sealed semiconductor device 10 of the embodiment 1 is the resin-sealed semiconductor device having higher resistance to a reverse bias at a high temperature than the conventional resin-sealed semiconductor device while being the resin-sealed semiconductor device which is manufactured by molding the mesa-type semiconductor element with a resin.

According to the resin-sealed semiconductor device 10 of the embodiment 1, the glass layer is formed by baking the layer made of the glass composition for protecting a semiconductor junction which is made of fine glass particles prepared from a material in a molten state obtained by melting a raw material which contains at least $SiO_2$, $Al_2O_2$, $B_2O_3$, ZnO, at least two oxides of alkaline earth metals selected from a group consisting of CaO, BaO and MgO, wherein the contents of the respective components are set as described above. Accordingly, as can be clearly understood from an example (evaluation aspect 4) described later, it is possible to set an average linear expansion coefficient within a temperature range of 50° C. to 550° C. to a linear expansion coefficient (for example, $3.33 \times 10^{-6}$ to $4.13 \times 10^{-6}$) close to a linear expansion coefficient of silicon. Accordingly, warping of a wafer in a step can be made extremely small and hence, a resin-sealed semiconductor device having an excellent forward breakdown voltage characteristic can be manufactured using a thin wafer and, at the same time, a resin-sealed semiconductor device having an excellent reverse breakdown voltage characteristic can be manufactured by increasing a thickness of the glass layer.

According to the resin-sealed semiconductor device 10 of the embodiment 1, the glass layer is formed by baking the layer made of the glass composition for protecting a semiconductor junction which is made of fine glass particles prepared from a material in a molten state obtained by melting a raw material which contains at least $SiO_2$, $Al_2O_2$, $B_2O_3$, ZnO, at least two oxides of alkaline earth metals selected from a group consisting of CaO, BaO and MgO, wherein the contents of the respective components are set as described above. Accordingly, as can be clearly understood from an example (evaluation aspect 2) described later, the glass layer can be baked at a relatively low temperature and hence, crystallization of the glass layer is hardly generated in the step of baking the glass layer. Also because of such an advantageous effect, a resin-sealed semiconductor device having a low reverse leakage current and eventually having high resistance to a reverse bias at a high temperature can be manufactured in a stable manner.

According to the resin-sealed semiconductor device 10 of the embodiment 1, the glass layer is formed by baking the layer made of the glass composition for protecting a semiconductor junction which contains none of components of the raw material as a filler. Accordingly, the layer made of the glass composition for protecting a semiconductor junction can be uniformly formed at the time of forming the layer made of the glass composition for protecting a semiconductor junction such that the layer covers an inner surface of a trench.

According to the resin-sealed semiconductor device 10 of the embodiment 1, the glass composition which substantially contains none of Li, Na and K is used. Accordingly, as can be clearly understood from an example (evaluation aspect 9) described later, even when B (boron) is contained in the glass composition, for example, there is no possibility that B (boron) diffuses into silicon from the glass layer during baking of the glass composition and hence, a highly reliable resin-sealed semiconductor device can be manufactured.

3. Method of Manufacturing Resin-Sealed Semiconductor Device

The resin-sealed semiconductor device 10 of the embodiment 1 can be manufactured by the following method (method of manufacturing a resin-sealed semiconductor device of the embodiment 1).

FIG. 4A to FIG. 4D and FIG. 5A to FIG. 5D are views for explaining the method of manufacturing a resin-sealed semiconductor device of the embodiment 1. FIG. 4A to FIG. 4D and FIG. 5A to FIG. 5D are views showing respective steps of the method of manufacturing a resin-sealed semiconductor device.

In the method of manufacturing a resin-sealed semiconductor device of the embodiment 1, as shown in FIG. 4A to FIG. 4D and FIG. 5A to FIG. 5D, "semiconductor substrate preparing step", "trench forming step", "glass layer forming step", "photo resist forming step", "oxide film removing step", "roughened surface region forming step", "electrode forming step", "semiconductor substrate cutting step", and "resin sealing step" are performed in this order. Hereinafter, the method of manufacturing a resin-sealed semiconductor device of the embodiment 1 is explained in the order of these steps.

(a) Semiconductor Substrate Preparing Step

Firstly, a $p^+$-type semiconductor layer 112 is formed by diffusion of a p-type impurity from one surface of an $n^-$-type semiconductor substrate ($n^-$-type silicon substrate) 110, and an $n^+$-type semiconductor layer 114 is formed by diffusion of an n-type impurity from the other surface of the $n^-$-type semiconductor substrate 110 thus forming a semiconductor substrate in which a pn junction arranged parallel to a main surface of the semiconductor substrate is formed. Thereafter, oxide films 116, 118 are formed by thermal oxidation on a surface of the $p^+$-type semiconductor layer 112 and a surface of the $n^+$-type semiconductor layer 114 respectively (see FIG. 4A).

(b) Trench Forming Step

Next, predetermined opening portions are formed on the oxide film 116 at predetermined positions by photo etching. After etching the oxide film, subsequently, the semiconductor substrate is etched thus forming trenches 120 having a depth exceeding the pn junction from one surface of the semiconductor substrate (see FIG. 4B).

(c) Glass Layer Forming Step

Figure 4A:
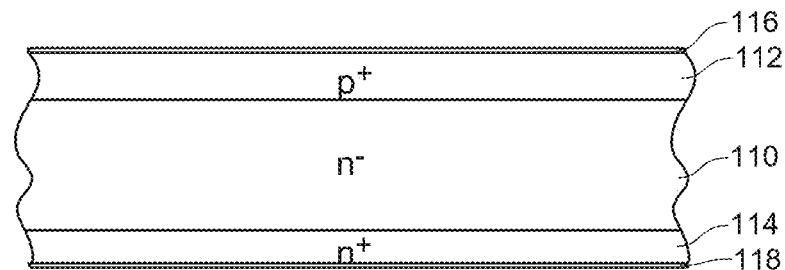
FIG. 4A to FIG. 4D are views for explaining a method of manufacturing a resin-sealed semiconductor device of the embodiment 1.
Figure 4B:
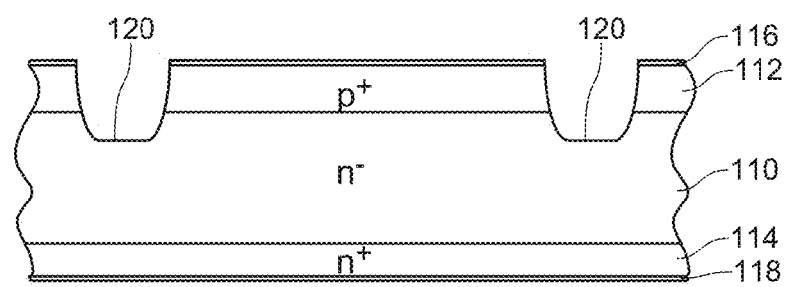
Figure 4C:
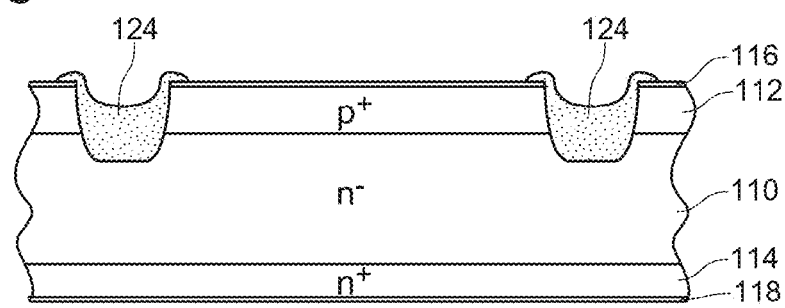

Next, a layer made of the glass composition for protecting a semiconductor junction is formed on inner surfaces of the trenches 120 and a surface of the semiconductor substrate in the vicinity of the trenches 120 by an electrophoresis method, and the layer made of the glass composition for protecting a semiconductor junction is baked so that the glass layer 124 for passivation is formed on the inner surfaces of the trenches 120 and the surface of the semiconductor substrate in the vicinity of the trenches 120 (see FIG. 4C). Accordingly, the pn junction exposure portion in the inside of the trench 120 is brought into a state where the pn junction exposure portion is directly covered with the glass layer 124. As the glass composition for protecting a semiconductor junction, a glass composition for protecting a semiconductor junction which substantially contains no Pb is used.

As such a glass composition for protecting a semiconductor junction, a glass composition for protecting a semiconductor junction which is made of fine glass particles prepared from a material in a molten state obtained by melting a raw material which contains at least $SiO_2$, $Al_2O_2$, $B_2O_3$, ZnO and at least two oxides of alkaline earth metals selected from a group consisting of CaO, BaO and MgO, the contents of the respective components being set as described below, and substantially contains none of Pb, As, Sb, Li, Na and K, and contains none of the components of the raw material as a filler is used.

the content of $SiO_2$ 49.5 mol % to 64.3 mol %
the content of $Al_2O_2$ 3.7 mol % to 14.8 mol %
the content of $B_2O_3$: 8.4 mol % to 17.9 mol %
the content of ZnO: 3.9 mol % to 14.2 mol %
the content of oxides of alkaline earth metals, 7.4 mol % to 12.9 mol %

(d) Photoresist Forming Step

Figure 4D:
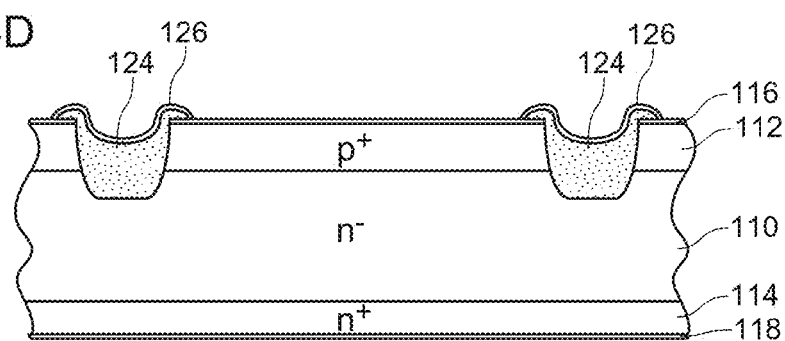

Next, a photo resist 126 is formed such that the photo resist 126 covers a surface of the glass layer 124 (see FIG. 4D).

(e) Oxide Film Removing Step

Figure 5A:
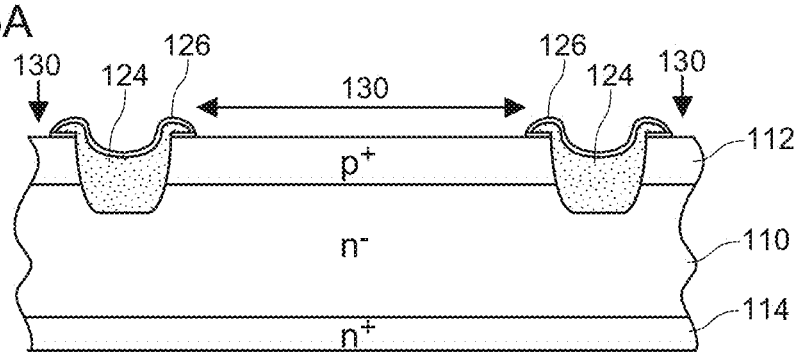
FIG. 5A to FIG. 5D are views for explaining the method of manufacturing a resin-sealed semiconductor device of the embodiment 1.

Next, the oxide film 116 is etched using the photoresist 126 as a mask so that the oxide film 116 at a position 130 where an Ni plating electrode film is to be formed is removed (see FIG. 5A).

(f) Roughened Surface Region Forming Step

Figure 5B:
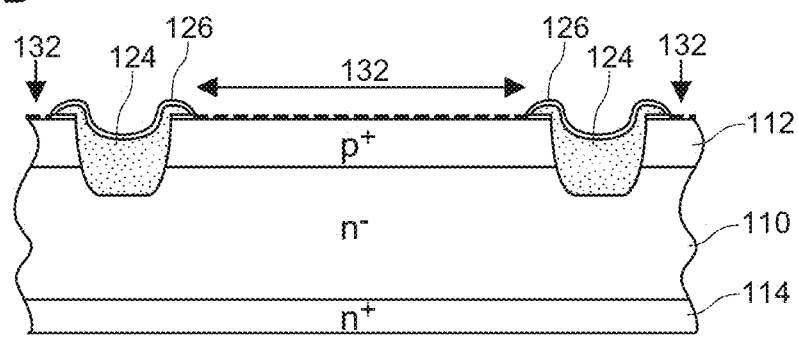

Next, a surface of the semiconductor substrate at the position 130 where the Ni-plating electrode film is to be formed is subjected to surface roughening treatment thus forming a roughened surface region 132 for enhancing adhesiveness between an Ni plating electrode and the semiconductor substrate (see FIG. 5B).

(g) Electrode Forming Step

Figure 5C:
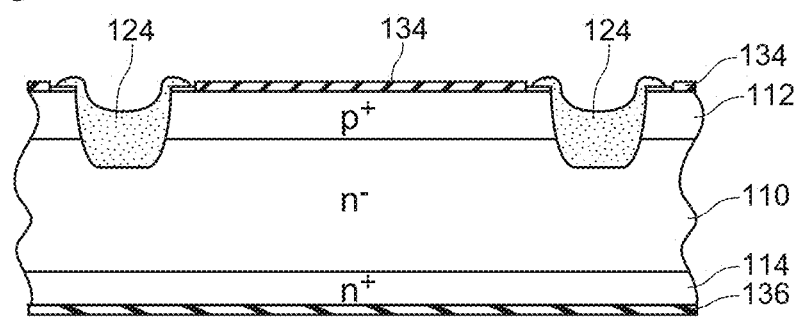

Next, Ni plating is applied to the semiconductor substrate thus forming an anode electrode layer 134 on the roughened surface region 132 and forming a cathode electrode layer 136 on the other surface of the semiconductor substrate (see FIG. 5C).

(h) Semiconductor Substrate Cutting Step

Figure 5D:
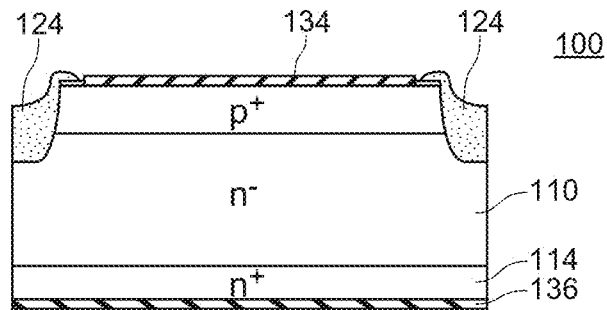

Next, the semiconductor substrate is cut by dicing or the like at a center portion of the glass layer 124 thus dividing the semiconductor substrate into chips whereby mesa-type semiconductor elements (pn diodes) 100 are manufactured (see FIG. 5D).

(i) Resin Sealing Step

Next, the mesa-type semiconductor element 100 is mounted on a die pad 23 of a lead frame not shown in the drawing (see FIG. 1). One electrode of the mesa-type semiconductor element 100 and a lead 21 are connected to each other, while the other electrode of the mesa-type semiconductor element 100 and a lead 22 are connected to each other by an Al wire 30. Then, these parts are arranged in a resin sealing die not shown in the drawing and, thereafter, a molding resin is injected into the inside of the die and is cured thus manufacturing a resin-sealed semiconductor device. The resin-sealed semiconductor device 10 of the embodiment 1 can be obtained by taking out the resin-sealed semiconductor device from the die.

Through the above-mentioned steps, the resin-sealed semiconductor device 10 of the embodiment 1 can be manufactured.

Embodiment 2

Figure 6:
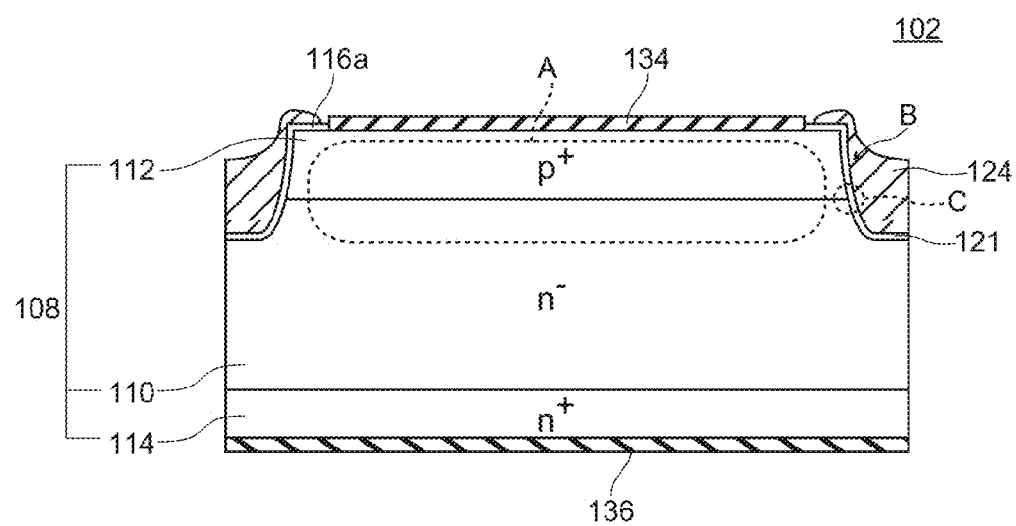
FIG. 6 is a view for explaining a mesa-type semiconductor element of an embodiment 2.

FIG. 6 is a view for explaining a mesa-type semiconductor element 102 of an embodiment 2.

A resin-sealed semiconductor device 12 of the embodiment 2 (not shown in the drawing) basically has the substantially same constitution as the resin-sealed semiconductor device 10 of the embodiment 1. However, the resin-sealed semiconductor device 12 of the embodiment 2 differs from the resin-sealed semiconductor device 10 of the embodiment 1 with respect to the constitution of the mesa-type semiconductor element. That is, in the mesa-type semiconductor element 102 of the embodiment 2, as shown in FIG. 6, an outer peripheral tapered region B is covered with a glass layer 124 with an insulation layer 121 interposed therebetween.

As described above, the resin-sealed semiconductor device 12 of the embodiment 2 differs from the resin-sealed semiconductor device 10 of the embodiment 1 with respect to the constitution of the mesa-type semiconductor element. However, in the same manner as the resin-sealed semiconductor device 10 of the embodiment 1, the mesa-type semiconductor element 102 has a glass layer made of lead-free glass (glass which contains no Pb) having a lower dielectric constant than lead-containing glass as the glass layer 124 and hence, ions of high concentration are hardly induced on an interface between a molded resin and the glass layer as well as on an interface between the glass layer and a semiconductor layer in the midst of performing a high-temperature reverse bias test whereby, as a result, a leakage current which is increased during the high-temperature reverse bias test can be decreased compared to the prior art.

As a result, the resin-sealed semiconductor device 12 of the embodiment 2 can acquire higher resistance to a reverse bias at a high temperature than the conventional resin-sealed semiconductor device, although the resin-sealed semiconductor device 12 of the embodiment 2 has the structure where the mesa-type semiconductor element is molded with a resin in the same manner as the conventional resin-sealed semiconductor device. That is, the resin-sealed semiconductor device 12 of the embodiment 2 is the resin-sealed semiconductor device having higher resistance to a reverse bias at a high temperature than the conventional resin-sealed semiconductor device while being the resin-sealed semiconductor device which is manufactured by molding the mesa-type semiconductor element with a resin.

According to the resin-sealed semiconductor device 12 of the embodiment 2, the glass layer is formed by baking a layer made of a glass composition for protecting a semiconductor junction which is made of fine glass particles prepared from a material in a molten state obtained by melting a raw material which contains at least $SiO_2$, $Al_2O_3$, $B_2O_3$, ZnO, and at least two oxides of alkaline earth metals selected from a group consisting of CaO, BaO and MgO, wherein the contents of the respective components are set as described above. Accordingly, in the same manner as the resin-sealed semiconductor device 10 of the embodiment 1, it is possible to set an average linear expansion coefficient within a temperature range of 50° C. to 550° C. to a linear expansion coefficient (for example, $3.33 \times 10^{-6}$ to $4.13 \times 10^{-6}$) close to a linear expansion coefficient of silicon. Accordingly, warping of a wafer in a step can be made extremely small and hence, a resin-sealed semiconductor device having an excellent forward breakdown voltage characteristic can be manufactured using a thin wafer and, at the same time, a resin-sealed semiconductor device having an excellent reverse breakdown voltage characteristic can be manufactured by increasing a thickness of the glass layer.

According to the resin-sealed semiconductor device 12 of the embodiment 2, the glass layer is formed by baking the layer made of the glass composition for protecting a semiconductor junction which is made of fine glass particles prepared from a material in a molten state obtained by melting a raw material which contains at least $SiO_2$, $Al_2O_2$, $B_2O_3$, ZnO, and at least two oxides of alkaline earth metals selected from a group consisting of CaO, BaO and MgO, wherein the contents of the respective components are set as described above. Accordingly, in the same manner as the resin-sealed semiconductor device 10 of the embodiment 1, the glass layer can be baked at a relatively low temperature and hence, crystallization of the glass layer is hardly generated in the step of baking the glass layer. Also because of such an advantageous effect, a resin-sealed semiconductor device having a low reverse leakage current and eventually having high resistance to a reverse bias at a high temperature can be manufactured in a stable manner.

Further, according to the resin-sealed semiconductor device 12 of the embodiment 2, the glass layer is formed by baking the layer which is made of the glass composition for protecting a semiconductor junction containing none of components of the raw material as a filler. Accordingly, in the same manner as the resin-sealed semiconductor device 10 of the embodiment 1, the layer made of the glass composition for protecting a semiconductor junction can be uniformly formed at the time of forming the layer made of the glass composition for protecting a semiconductor junction such that the layer covers the inner surface of the trench.

Further, according to the resin-sealed semiconductor device 12 of the embodiment 2, the glass composition which substantially contains none of Li, Na and K is used. Accordingly, as can be clearly understood from an example (evaluation aspect 9) described later, even when B (boron) is contained in the glass composition, for example, there is no possibility that B (boron) diffuses into silicon from the glass layer during baking of the glass composition and hence, a highly reliable resin-sealed semiconductor device can be manufactured.

According to the resin-sealed semiconductor device 12 of the embodiment 2, the outer peripheral tapered region B is covered with the glass layer 124 with the insulation layer 121 interposed therebetween. Accordingly, it is also possible to acquire an advantageous effect that bubbles are hardly generated in a sintering step and an advantageous effect that a reverse leakage current in the resin-sealed semiconductor device can be further decreased.

The resin-sealed semiconductor device 12 of the embodiment 2 can be manufactured by the following method (method of manufacturing a resin-sealed semiconductor device of the embodiment 2).

FIG. 7A to FIG. 7D and FIG. 8A to FIG. 8D are views for explaining the method of manufacturing a resin-sealed semiconductor device of the embodiment 2. FIG. 7A to FIG. 7D and FIG. 8A to FIG. 8D are views showing respective steps of the method of manufacturing a resin-sealed semiconductor device.

In the method of manufacturing a resin-sealed semiconductor device of the embodiment 2, as shown in FIG. 7A to FIG. 7D and FIG. 8A to FIG. 8D, "semiconductor substrate preparing step", "trench forming step", "insulation layer forming step", "glass layer forming step", "photo resist forming step", "oxide film removing step", "roughened surface region forming step", "electrode forming step", "semiconductor substrate cutting step", and "resin sealing step" are performed in this order. Hereinafter, the method of manufacturing a resin-sealed semiconductor device of the embodiment 2 is explained in the order of these steps.

(a) Semiconductor Substrate Preparing Step

Firstly, a p$^+$-type semiconductor layer 112 is formed by diffusion of a p-type impurity from one surface of an n$^-$-type semiconductor substrate (n$^-$-type silicon substrate) 110, and an n$^+$-type semiconductor layer 114 is formed by diffusion of an n-type impurity from the other surface of the n$^-$-type semiconductor substrate 110 thus forming a semiconductor substrate in which a pn junction arranged parallel to a main surface of the semiconductor substrate is formed. Thereafter, oxide films 116, 118 are formed by thermal oxidation on a surface of the p$^+$-type semiconductor layer 112 and a surface of the n$^+$-type semiconductor layer 114 respectively.

(b) Trench Forming Step

Next, predetermined opening portions are formed on the oxide film 116 at predetermined positions by photo etching. After etching the oxide film, subsequently, the semiconductor substrate is etched thus forming trenches 120 having a depth exceeding the pn junction from one surface of the semiconductor substrate (see FIG. 7A).

(c) Insulation Layer Forming Step

Figure 7A:
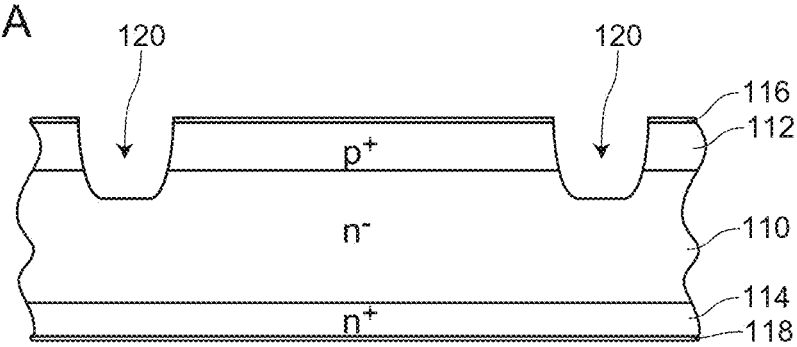
FIG. 7A to FIG. 7D are views for explaining a method of manufacturing a resin-sealed semiconductor device of the embodiment 2.
Figure 7B:
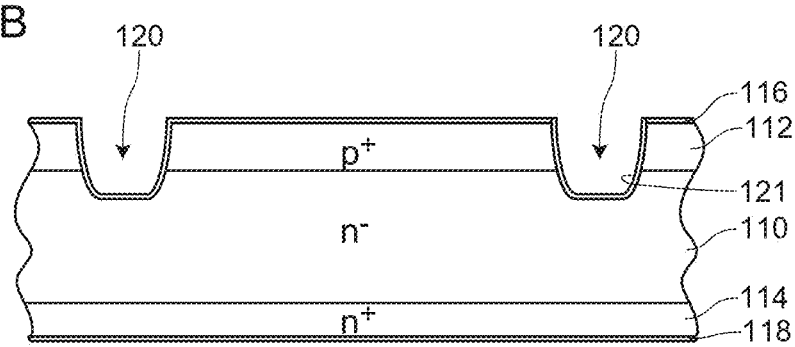

Next, an insulation layer 121 formed of a silicon oxide film is formed on inner surfaces of the trenches 120 by a thermal oxidation method using dry oxygen (DryO$_2$) (see FIG. 7B). A thickness of the insulation layer 121 is set to a value which falls within a range of 5 nm to 60 nm (20 nm, for example). The insulation layer is formed such that a semiconductor base body is introduced into a diffusion furnace and, thereafter, thermal oxidation treatment is performed at a temperature of 900° C. for 10 minutes while supplying an oxygen gas into the diffusion furnace. When the thickness of the insulation layer 121 is less than 5 nm, there may be a case where a reverse current reduction effect cannot be acquired. On the other hand, when the thickness of the insulation layer 121 exceeds 60 nm, there may be a case where a layer made of a glass composition cannot be formed by an electrophoresis method in a next glass layer forming step.

(d) Glass Layer Forming Step

Figure 7C:
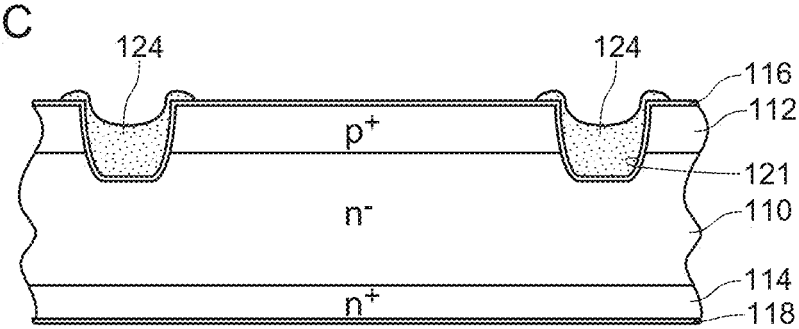

Next, a layer made of the glass composition for protecting a semiconductor junction is formed on inner surfaces of the trenches 120 and a surface of the semiconductor substrate in the vicinity of the trenches 120 by an electrophoresis method, and the layer made of the glass composition for protecting a semiconductor junction is baked so that the glass layer 124 for passivation is formed on the inner surfaces of the trenches 120 and the surface of the semiconductor substrate in the vicinity of the trenches 120 (see FIG. 7C). Here, as the glass composition for protecting a semiconductor junction, a glass composition for protecting a semiconductor junction substantially equal to the glass composition for protecting a semiconductor junction of the first embodiment 1 is used.

In forming the layer made of the glass composition for protecting a semiconductor junction on the inner surfaces of the trenches 120, the layer made of the glass composition for protecting a semiconductor junction is formed such that the layer covers the inner surface of trench 120 with the insulation layer 121 interposed therebetween. Accordingly, the pn junction exposure portion in the trench 120 is brought into a state where the pn junction exposure portion is covered with the glass layer 124 with the insulation layer 121 interposed therebetween.

(e) Photoresist Forming Step

Figure 7D:
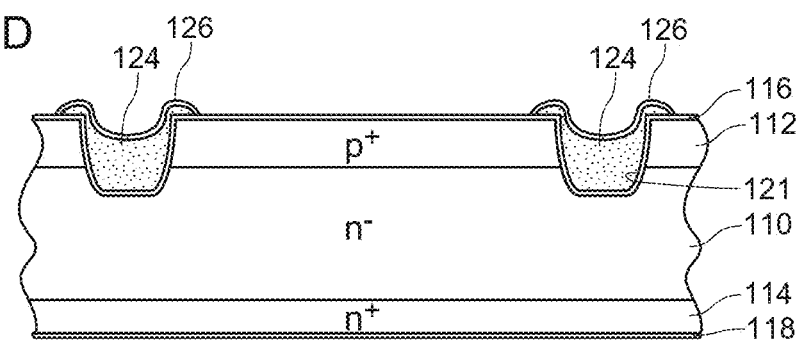

Next, a photo resist 126 is formed such that the photo resist 126 covers a surface of the glass layer 124 (see FIG. 7D).

(f) Oxide Film Removing Step

Figure 8A:
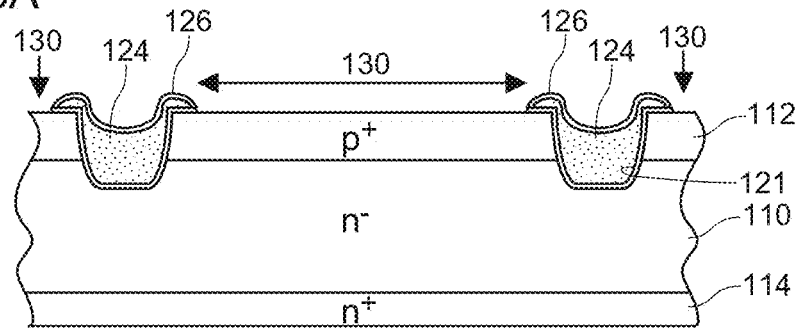
FIG. 8A to FIG. 8D are views for explaining a method of manufacturing a resin-sealed semiconductor device of the embodiment 2.

Next, the oxide film 116 is etched using the photoresist 126 as a mask so that the oxide film 116 at a position 130 where an Ni plating electrode film is to be formed is removed (see FIG. 8A).

(g) Roughened Surface Region Forming Step

Figure 8B:
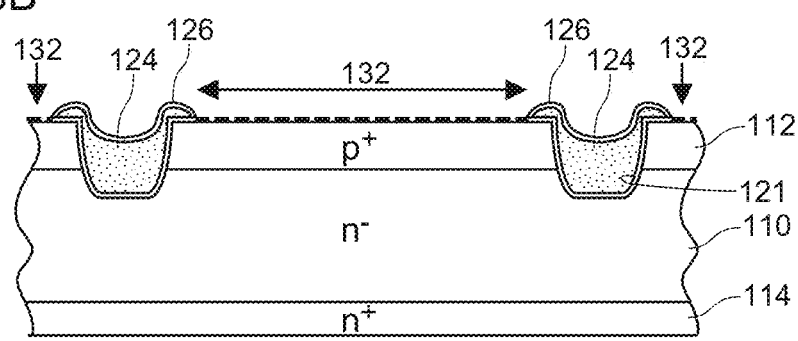

Next, a surface of the semiconductor substrate at the position 130 where the Ni-plating electrode film is to be formed is subjected to surface roughening treatment thus forming a roughened surface region 132 for enhancing adhesiveness between an Ni plating electrode and the semiconductor substrate (see FIG. 8B).

(h) Electrode Forming Step

Figure 8C:
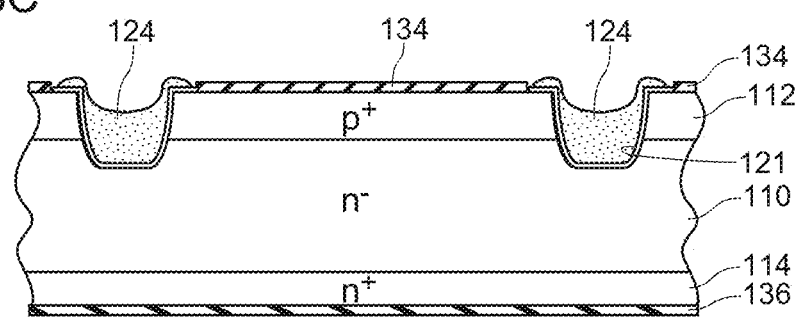

Next, Ni plating is applied to the semiconductor substrate thus forming an anode electrode 134 on the roughened surface region 132 and forming a cathode electrode 136 on the other surface of the semiconductor substrate (see FIG. 8C).

(i) Semiconductor Substrate Cutting Step

Figure 8D:
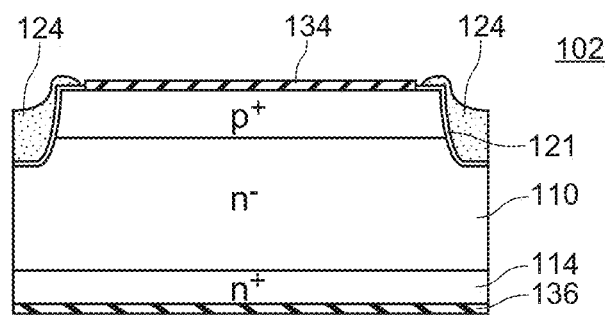

Next, the semiconductor substrate is cut by dicing or the like at a center portion of the glass layer 124 thus dividing the semiconductor substrate into chips whereby mesa-type semiconductor elements (pn diodes) 102 are manufactured (see FIG. 8D).

(j) Resin Sealing Step

Next, the mesa-type semiconductor element 102 is mounted on a die pad 23 of a lead frame not shown in the drawing (see FIG. 1). One electrode of the mesa-type semiconductor element 102 and a lead 21 are connected to each other, while the other electrode of the mesa-type semiconductor element 102 and a lead 22 are connected to each other by an Al wire 30. Then, these parts are arranged in a resin sealing die not shown in the drawing and, thereafter, a molding resin is injected into the inside of the die and is cured thus manufacturing a resin-sealed semiconductor device. The resin-sealed semiconductor device 12 of the embodiment 2 can be obtained by taking out the resin-sealed semiconductor device from the die.

Through the above-mentioned steps, the resin-sealed semiconductor device 12 of the embodiment 2 can be manufactured.

EXAMPLES

1. Preparation of Samples

FIG. 9 is a Table showing conditions and results of examples. Raw materials are prepared at composition ratios indicated in examples 1 to 8 and comparison examples 1 to 4 (see FIG. 9). The raw materials are sufficiently mixed and stirred together by a mixer and, thereafter, the mixed raw material is put into a platinum crucible and is melted in an electric furnace by elevating the temperature to a predetermined temperature (1350° C. to 1550° C.) and holding the temperature for two hours. Then, the material in a molten state is made to flow out from the crucible and is fed to water-cooled rolls so that glass flakes in a flaky shape are obtained. The glass flakes are pulverized by a ball mill until the glass flakes obtain an average particle size of 5 μm thus obtaining powdery glass composition.

The raw materials used in the examples are $SiO_2$, $Al_2O_3$, $H_3BO_2$, ZnO, $CaCO_3$, $BaCO_3$, MgO, NiO (nickel oxide), $ZrO_2$, PbO, $K_2CO_3$ and $Na_2CO_3$.

2. Evaluation

The respective glass compositions obtained by the above-mentioned methods are evaluated in accordance with the following evaluation aspects. Out of the respective evaluation aspects 1 to 9, with respect to the evaluation aspects 5, 7, 8, a glass layer is formed on a semiconductor base body with an insulation layer interposed therebetween in the examples 1 to 6, while a glass layer is directly formed on a semiconductor base body in the examples 7 to 8 and the comparison examples 1 to 4. The baking of the glass layer is performed at a temperature of 800° C. to 900° C., and a baking time is set to 15 minutes. The glass composition of the comparison example 1 is a conventional "glass composition containing lead silicate as a main component". The glass composition of the comparison example 2 is a conventionally-known "lead-free glass composition (commercially-available lead-free glass for passivation)". The glass composition of the comparison example 3 is equal to the glass composition of the example 3. The glass composition of the comparison example 4 is a glass composition ($SiO_2$—$B_2O_3$—$K_2O$—$Na_2O$-system glass composition) which contains both B and alkaline metal.

(1) Evaluation Aspect 1 (Environmental Burden)

From a viewpoint of the environmental burden, the score "good" is given when the glass composition contains no lead component, and the score "bad" is given when the glass composition contains a lead component.

(2) Evaluation Aspect 2 (Baking Temperature)

When the baking temperature is excessively high, the baking temperature largely influences a semiconductor device in a manufacturing process. Accordingly, the score "good" is given when the baking can be performed at a temperature of 900° C. or below, and the score "bad" is given when the baking cannot be performed at a temperature of 900° C. or below.

(3) Evaluation Aspect 3 (Resistance to Chemicals)

The score "good" is given when the glass composition exhibits insolubility to both aqua regia and a plating liquid, and the score "bad" is given when the glass composition exhibits solubility to at least one of aqua regia and a plating liquid.

(4) Evaluation Aspect 4 (Average Linear Expansion Coefficient)

Glass plates in a flaky shape are prepared from a material in a molten state obtained in the above-mentioned "1. Preparation of samples", and an average linear expansion coefficient of the glass composition at a temperature of 50° C. to 550° C. is measured by using the glass plates in a flaky shape. The average linear expansion coefficient is measured by a total expansion measuring method (temperature elevation speed: 10° C./min) using Thermomechanical Analyzers TMA-60 made by SHIMADZU CORP where silicon single crystal having a length of 20 mm is used as a standard sample.

Figure 10A:
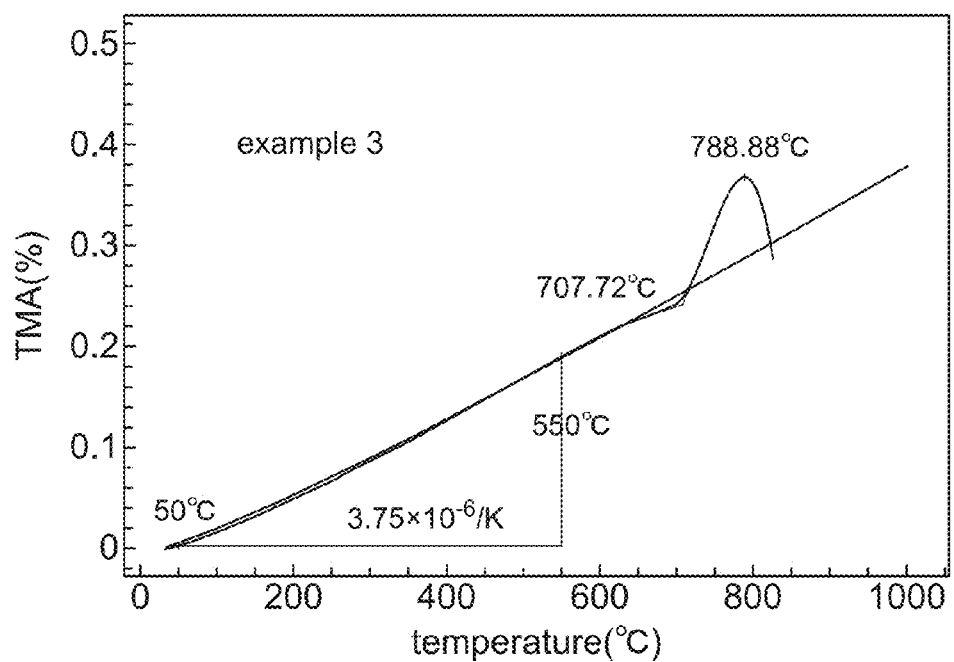
FIG. 10A and FIG. 10B are graphs showing one example of the result of measurement of an average linear expansion coefficient.
Figure 10B:
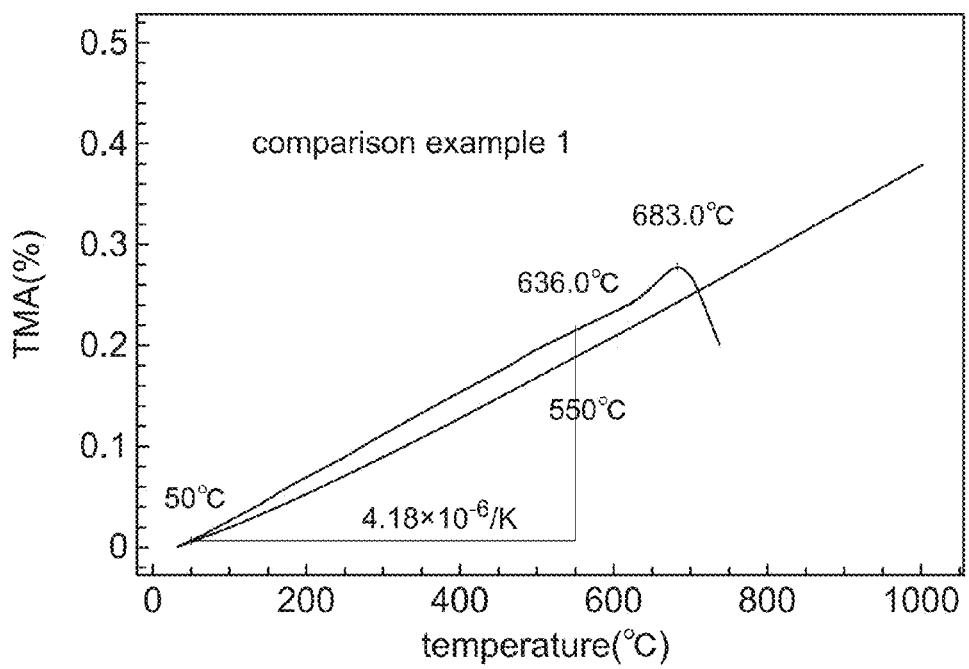

FIG. 10A and FIG. 10B are graphs showing one example of the result of measurement of an average linear expansion coefficient. FIG. 10A is a graph showing the result of measurement with respect to the glass composition for protecting a semiconductor junction of the example 3, and FIG. 10B is a graph showing the result of measurement with respect to the glass composition for protecting a semiconductor junction of the comparison example 1. The score "good" is given when the difference between the average linear expansion coefficient of the glass composition within a temperature range of 50° C. to 550° C. and the linear expansion coefficient ($3.73 \times 10^{-6}$) of silicon within a temperature range of 50° C. to 550° C. is equal to or below "$0.4 \times 10^{-6}$", and the score "bad" is given when such difference exceeds "$0.4 \times 10^{-6}$". In the column of the evaluation aspect 4 in FIG. 9, numerals in parentheses indicate values obtained by multiplying average linear expansion coefficients of the glass compositions within a temperature range of 50° C. to 550° C. by $10^{-6}$.

(5) Evaluation Aspect 5 (Presence or Non-Presence of Crystallization)

A semiconductor device (pn diode) is manufactured by a method substantially equal to the method of manufacturing a semiconductor device of the embodiment 1. As the result, the score "good" is given when vitrification can be performed without causing the crystallization of the glass composition in a manufacturing step, and the score "bad" is given when vitrification cannot be performed due to the crystallization.

(6) Evaluation Aspect 6 (Presence or Non-Presence of Generation of Bubbles)

A semiconductor device (pn diode) is manufactured by a method substantially equal to the method of manufacturing a semiconductor device of the embodiment 1 (examples 7, 8, and comparison examples 1 to 4) or the embodiment 2 (examples 1 to 6), and the observation is made whether or not bubbles are generated in the inside of the glass layer 124 (particularly, in the vicinity of an interface between the semiconductor base body and the glass layer 124) (preliminary evaluation). Then, layers made of glass compositions are formed by applying the glass compositions of the examples 1 to 8 and the comparison examples 1 to 4 to semiconductor base bodies having a size of 10 mm×10 mm and glass layers are formed by baking the layers made of the glass compositions. Thereafter, the observation is made whether or not bubbles are generated in the inside of the glass layers (particularly, in the vicinity of an interface between the semiconductor base body and the glass layer) (subsequent evaluation).

Figure 11A:
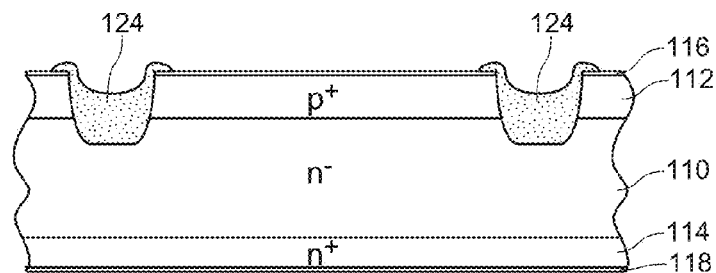
FIG. 11A and FIG. 11B are views for explaining bubbles generated in the inside of a glass layer in a preliminary evaluation.
Figure 11B:
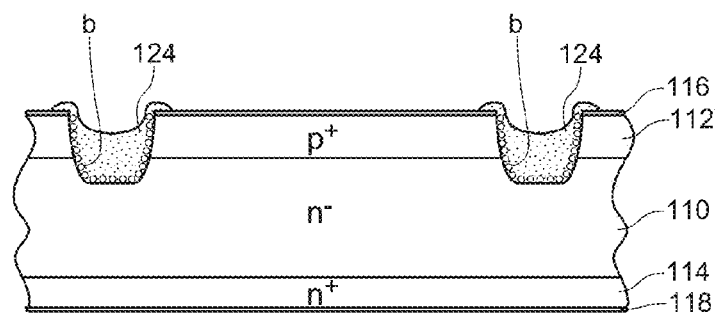
Figure 12A:
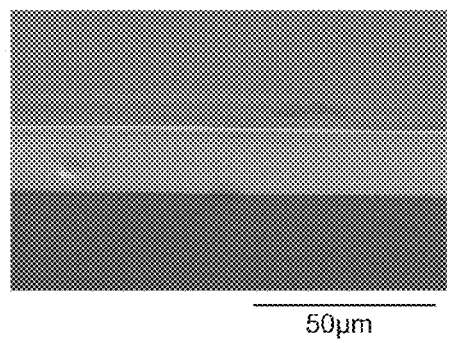
FIG. 12A and FIG. 12B are photographs for explaining bubbles generated in the inside of a glass layer in a subsequent evaluation.
Figure 12B:
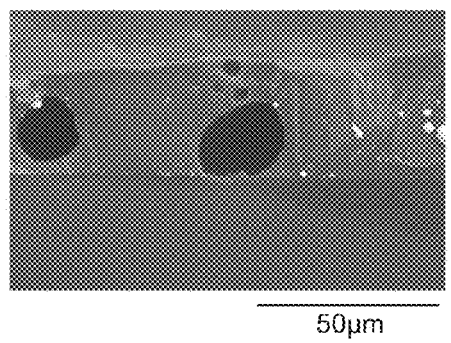

FIG. 11A and FIG. 11B are views for explaining bubbles b generated in the inside of the glass layer 124 in the preliminary evaluation. FIG. 11A is a cross-sectional view of a semiconductor device when no bubbles b are generated, while FIG. 11B is a cross-sectional view of a semiconductor device when bubbles b are generated. FIG. 12A and FIG. 12B are photographs for explaining bubbles b generated in the inside of the glass layer 124 in the subsequent evaluation. FIG. 12A is a photograph showing an interface between the semiconductor base body and the glass layer when no bubbles b are generated in an enlarged manner, and FIG. 12B is a photograph showing an interface between the semiconductor base body and the glass layer when bubbles b are generated in an enlarged manner. As the result of the experiment, it is found that there is enough correlation between the result of the preliminary evaluation and the result of the evaluation of the present invention. In the subsequent evaluation, the score "good" is given when no bubbles having a diameter of 50 µm or more are generated in the inside of the glass layer, the score "fair" is given when one to twenty bubbles having a diameter of 50 µm or more are generated in the inside of the glass layer, and the score "bad" is given when twenty one or more bubbles having a diameter of 50 µm or more are generated in the inside of the glass layer.

(7) Evaluation Aspect 7 (Reverse Leakage Current)

Figure 13A:
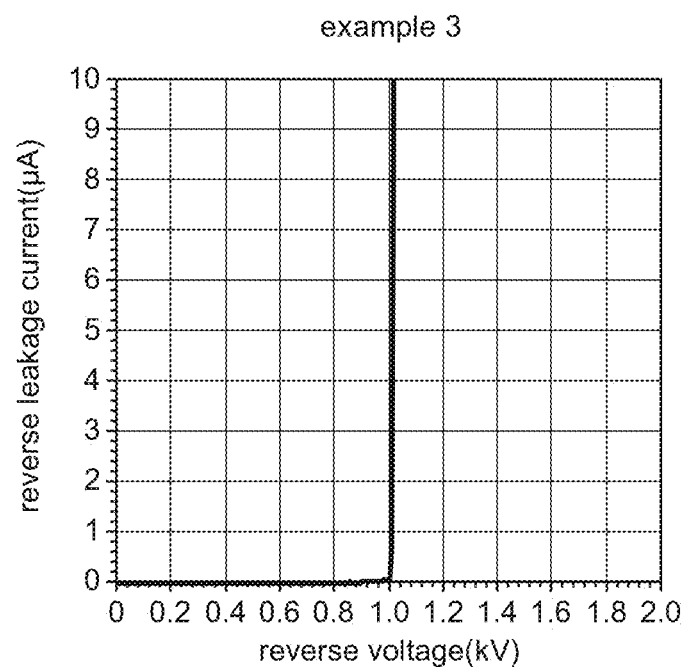
FIG. 13A and FIG. 13B are graphs showing reverse currents in the examples.
Figure 13B:
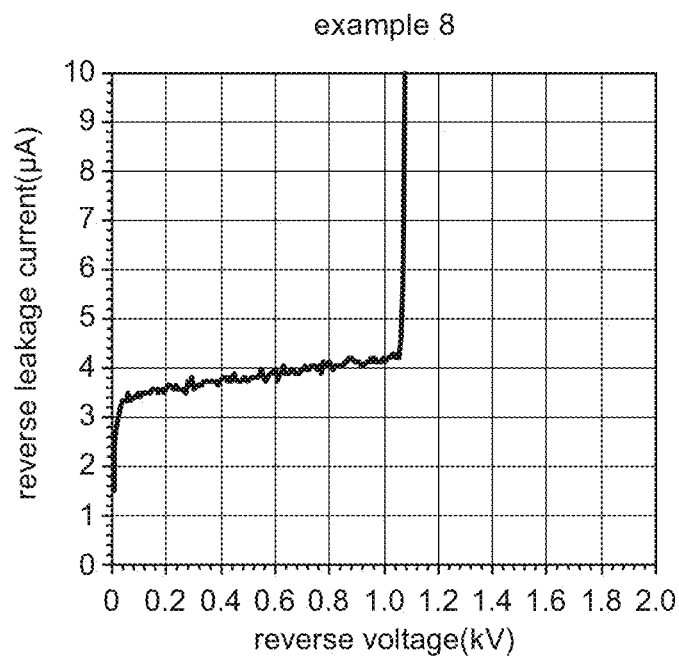

A semiconductor device (pn diode) is manufactured by a method substantially equal to the method of manufacturing a semiconductor device of the embodiment 1 (examples 7, 8, and comparison examples 1 to 4) and the embodiment 2 (examples 1 to 6), and a reverse current of the prepared semiconductor device is measured. FIG. 13A and FIG. 13B are views showing reverse leakage currents in the examples. Out of these drawings, FIG. 13A is a view showing a reverse leakage current in the example 3, and FIG. 13B is a view showing a reverse leakage current in the example 8. As the result, in the resin-sealed semiconductor device of the example 3 where the glass layer is formed on the semiconductor substrate with the insulation layer interposed therebetween, as shown in FIG. 13A, a reverse leakage current when a reverse voltage VR of 600V is applied to the resin-sealed semiconductor device is 1 µA or below. In the resin-sealed semiconductor device of the example 8 where the glass layer is directly formed on the semiconductor substrate, as shown in FIG. 13B, a reverse leakage current when a reverse voltage VR of 600V is applied to the resin-sealed semiconductor device is 10 µA or below. In the case where a reverse voltage VR of 600V is applied to the resin-sealed semiconductor device, the score "good" is given when the reverse leakage current is 10 µA or below, and the score "bad" is given when a reverse leakage current exceeds 10 µA.

(8) Evaluation Aspect 8 (Resistance to Reverse Bias at High Temperature)

A semiconductor device which is manufactured by a method substantially equal to the method of manufacturing a semiconductor device of the embodiment 1 (examples 7, 8, and comparison examples 1 to 4) or the embodiment 2 (examples 1 to 6) is molded with a resin thus forming a resin-sealed semiconductor device, a high-temperature reverse bias test is performed with respect to the resin-sealed semiconductor device, and a resistance to a reverse bias at a high temperature is measured. The high-temperature reverse bias test is performed by measuring a reverse current for 20 hours for every 5 minutes in a state where a sample is placed in a thermostatic-bath high-temperature bias tester where a temperature condition is set to 175° C. and a potential of 600V is applied between the anode electrode and the cathode electrode.

Figure 14:
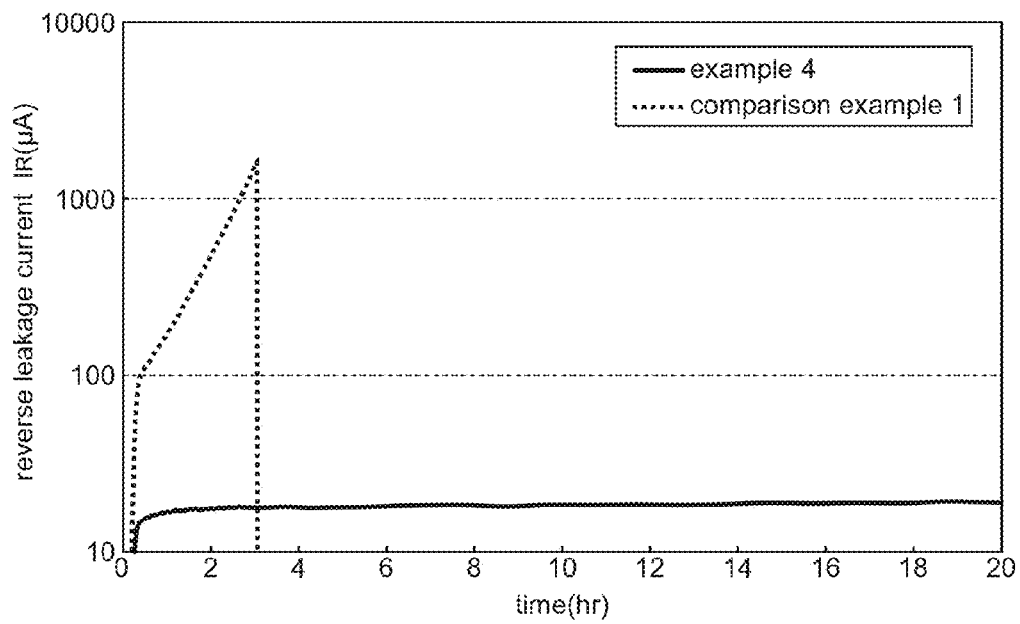
FIG. 14 is a graph showing the result of a high-temperature reverse bias test.

FIG. 14 is a graph showing the result of high-temperature reverse bias test. In FIG. 14, a solid line indicates a reverse leakage current with respect to a sample prepared using the glass composition of the example 4, and a broken ling indicates a reverse leakage current with respect to a sample prepared using the glass composition of the comparison example 1. As shown in FIG. 14, with respect to the sample prepared using the glass composition of the comparison example 1, a reverse leakage current is increased with the lapse of time even after the reverse leakage current is increased along with the temperature elevation immediately after the high-temperature reverse bias test starts, and the reverse leakage current reaches a predetermined reverse leakage current after the lapse of three hours from a point of time at which the high-temperature reverse bias test starts and hence, the high-temperature reverse bias test is terminated. To the contrary, with respect to the sample prepared using the glass composition of the example 4, it is found that a reverse leakage current is hardly increased after the reverse leakage current is increased along with the temperature elevation immediately after the high-temperature reverse bias test starts. As the result, the score "good" is given when a reverse leakage current is hardly increased after the reverse leakage current is increased along with the temperature elevation immediately after the high-temperature reverse bias test starts as described above, and the score "bad" is given when a reverse leakage current is increased with the lapse of time even after the reverse leakage current is increased along with the temperature elevation immediately after the high-temperature reverse bias test starts.

(9) Evaluation Aspect 9 (Presence or Non-Presence of Diffusion of B from Glass Layer)

A glass composition layer is formed on a surface of an n-type silicon substrate (impurity concentration: $2.0 \times 10^{14}$ $cm^{-3}$) by an electrophoresis method and, thereafter, the glass composition layer is baked in a wet oxygen atmosphere at a temperature of 800° C. thus forming a glass layer. As the glass composition, the glass composition of the example 1 and the glass composition of the comparison example 4 are used. Then, the glass layer is removed by using a hydrofluoric acid so as to expose the surface of the n-type silicon substrate. Thereafter, the SRP (spreading Resistance Profiler) distribution is measured in the depth direction from the surface of the n-type silicon substrate using a spreading resistance measuring device (SSM2000 made by Semilab Japan K.K.), and an impurity concentration is calculated based on the obtained spreading resistance.

Figure 15:
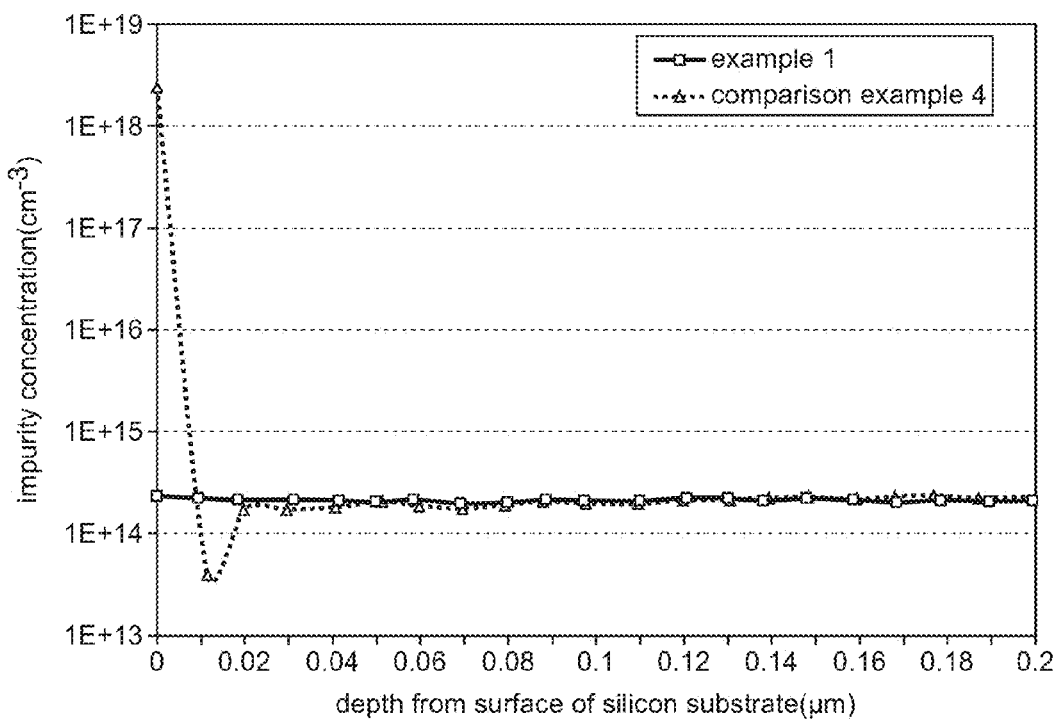
FIG. 15 is a graph showing impurity concentration along the direction of a depth from a surface of a silicon substrate.

FIG. 15 is a graph showing the distribution of impurity concentration along the direction of a depth from a surface of a silicon substrate. In FIG. 15, a solid line indicates the distribution of impurity concentration with respect to a sample prepared using the glass composition of the example 1, and a broken line indicates the distribution of impurity concentration with respect to a sample prepared using the glass composition of the comparison example 4. As shown in FIG. 15, it is found that, in the sample prepared using the glass composition of the comparison example 4, a p-type impurity layer is formed in the surface of the silicon substrate up to a depth of 10 nm. This means that, in the glass composition containing both B (boron) and alkaline metal, B (boron) is diffused into the silicon substrate from the glass layer during baking the glass composition. To the contrary, it is found that, in the sample prepared using the glass composition of the example 1, a p-type impurity layer is not formed in the surface of the silicon substrate. This means that, in the glass composition containing no alkaline metal, even when the glass composition contains B (boron), B (boron) is not diffused into the silicon substrate from the glass layer during baking the glass composition. Accordingly, the score "good" is given when the glass composition is a glass composition where there exists no possibility that B (boron) is diffused into the silicon substrate from the glass layer during baking the glass composition while being the glass composition containing B (boron), and the score "bad" is given when the glass composition is a glass composition where B (boron) is diffused into the silicon substrate from the glass layer during baking the glass composition.

(10) Comprehensive Evaluation

The score "good" is given when the score "fair" or "bad" is not present at all with respect to the above-mentioned evaluation aspects 1 to 9, and the score "bad" is given when the score "fair" or "bad" is given with respect to at least one of the respective evaluation aspects.

3. Evaluation Result

As can be understood also from FIG. 9, in all comparison examples 1 to 4, the score "bad" is given with respect to at least one of the evaluation aspects so that the score "bad" is given with respect to the comprehensive evaluation. That is, in the comparison example 1, the score "bad" is given with respect to the evaluation aspects 1, 4, 8. In the comparison example 2, the score "bad" is given with respect to the evaluation aspects 3, 4. In the comparison example 3, the score "bad" is given with respect to the evaluation aspect 6. In the comparison example 4, the score "bad" is given with respect to the evaluation aspects 4, 7, 9.

To the contrary, in all glass compositions according to the examples 1 to 8, the score "good" is given with respect to all evaluation aspects (evaluation aspects 1 to 9). As the result, it is found that, with respect to all glass compositions according to the examples 1 to 8, it is possible to manufacture a resin-sealed semiconductor device having higher resistance to a reverse bias at a high temperature than the conventional resin-sealed semiconductor device. It is found that it is possible to manufacture a resin-sealed semiconductor device which satisfies all of the following conditions (a) to (g), that is, the condition (a) that the glass composition can be baked at a proper temperature (for example, 900° C. or below), the condition (b) that the glass composition withstands chemicals (both aqua regia and a plating liquid), the condition (c) that the glass composition has a linear expansion coefficient close to a linear expansion coefficient of silicon (particularly an average linear expansion coefficient at a temperature range of 50° C. to 550° C. being close to a linear expansion coefficient of silicon), the condition (d) that the glass composition is not crystallized in the process of vitrification, the condition (e) that the glass composition can suppress the generation of bubbles which may occur from an interface between the glass composition and the semiconductor based body during baking the layer made of the glass composition and can suppress the deterioration of a reverse breakdown voltage characteristic of the semiconductor device, the condition (f) that, as the result, an addition amount of NiO (nickel oxide) is suppressed to 2.0 mol % or below, the condition (g) that a reverse leakage current is low, and the condition (h) that B (boron) is not diffused into the silicon substrate from the glass layer during baking the glass composition for protecting a semiconductor junction while using the glass composition for protecting a semiconductor junction which contains B (boron).

It is found from another experiment that when resin-sealed semiconductor devices are prepared by the method of manufacturing a resin-sealed semiconductor device of the embodiment 2 using the glass compositions of the examples 1 to 6, it is possible to manufacture resin-sealed semiconductor devices having a lower reverse current than the resin-sealed semiconductor devices manufactured by the method of manufacturing a resin-sealed semiconductor device of the embodiment 2 using the glass compositions of the examples 7 and 8 under broad baking conditions.

It is also found from another experiment that the glass compositions according to the examples 1 to 6 are glass compositions where bubbles are hardly generated from an interface between a silicon substrate and a glass layer in the step of forming the glass layer by baking a layer made of the glass composition compared to the glass compositions of the examples 7 and 8.

[Preliminary Experiment]

In determining the glass compositions of the above-mentioned examples 1 to 8, a preliminary experiment is made at 18 levels, and the determination is made based on the results of this experiment. FIG. 16 is a Table showing the compositions and the results of the experiment at 18 levels. The following matters (1) to (4) are found from FIG. 16.

(1) From a viewpoint of the difficulty of crystallization in the process of vitrification, it is found that there exist the following tendencies, that is, the tendency that the smaller a total content of the content of $SiO_2$ and the content of $B_2O_3$, the more difficult the crystallization becomes, the tendency that the larger the content of $Al_2O_3$, the more difficult the crystallization becomes, the tendency that the smaller the content of ZnO, the more difficult the crystallization becomes, and the tendency that the larger the content of oxide of alkaline earth metal, the more difficult the crystallization becomes.

(2) From a viewpoint of an average linear expansion coefficient α within a temperature range of 50° C. to 550° C., it is considered that there exist a tendency that the larger a total content of the content of $SiO_2$ and the content of $B_2O_3$, the smaller the average linear expansion coefficient α becomes, and a tendency that the larger the content of $Al_2O_3$, the smaller the average linear expansion coefficient α becomes. Here, with respect to the content of ZnO, it is found that the larger the content of ZnO, the smaller the average linear expansion coefficient α becomes. However, this is because that the average linear expansion coefficient α becomes small due to the crystallization and hence, it is considered that the smaller the content of ZnO, the more the vitrification is enhanced.

(3) From a viewpoint of a glass transition temperature Tg, it is found that there exist the following tendencies, that is, a tendency that the smaller a total content of the content of $SiO_2$ and the content of $B_2O_3$, the lower the glass transition temperature Tg becomes, a tendency that the larger a rate of the content of $B_2O_3$ to the content of $SiO_2$, the lower the glass transition temperature Tg becomes, a tendency that the smaller the content of $Al_2O_3$, the lower the glass transition temperature Tg becomes, and a tendency that the larger the content of ZnO, the lower the glass transition temperature Tg becomes.

From a viewpoint of a yield point (softening temperature) Ts, it is found that there exist the following tendencies, that is, a tendency that the smaller a total content of the content of $SiO_2$ and the content of $B_2O_3$, the lower the yield point Is becomes, a tendency that the larger a rate of the content of $B_2O_3$ to the content of $SiO_2$, the lower the yield point Is becomes, and a tendency that the larger the content of BaO, the lower the yield point Is becomes.

Although the resin-sealed semiconductor device, and the method of manufacturing a resin-sealed semiconductor device according to the present invention have been explained heretofore in conjunction with the above-mentioned embodiments, the present invention is not limited to the above-mentioned embodiments, and can be carried out without departing from the gist of the present invention. For example, the following modifications are conceivable.

(1) In the above-mentioned embodiments 1 and 2, the mesa-type semiconductor element which is constituted of a diode (pn diode) is used. However, the present invention is not limited to such embodiments. For example, a mesa-type semiconductor element constituted of a thyristor may be used. Further, besides the mesa-type semiconductor element constituted of a thyristor, the present invention is also applicable to semiconductor devices in general where a pn junction is exposed (for example, power MOSFET, IGBT and the like).

Figure 17:
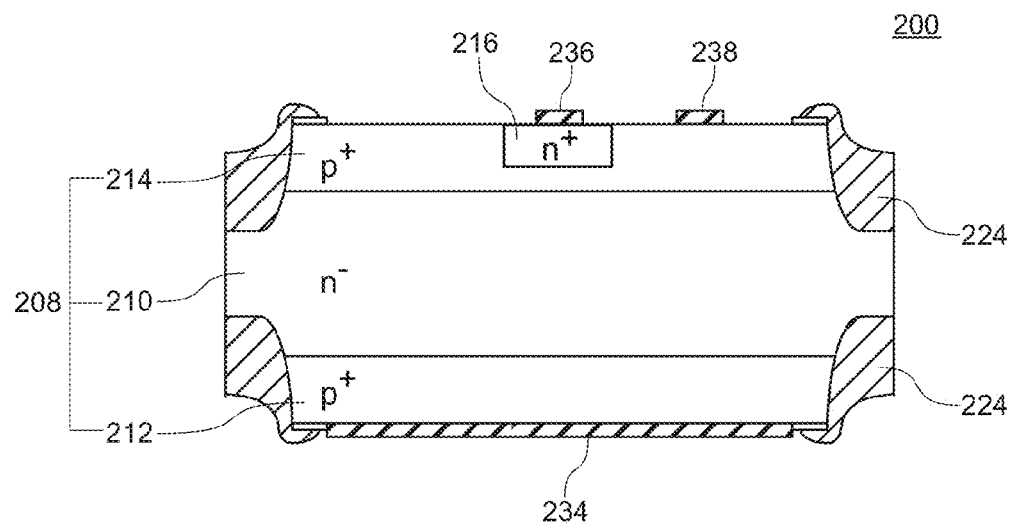
FIG. 17 is a view for explaining a mesa-type semiconductor element according to a modification.
Figure 18:
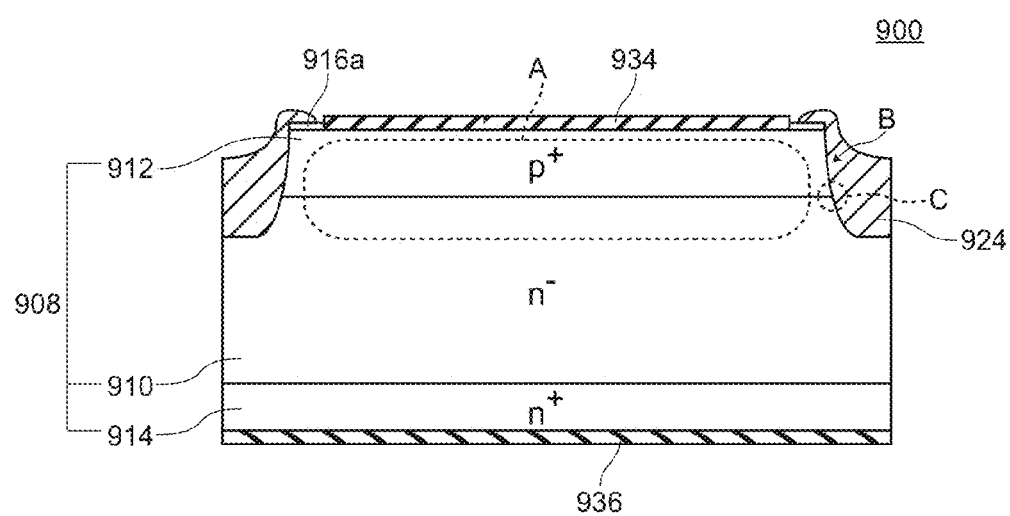
FIG. 18 is a view for explaining a conventional mesa-type semiconductor element.

FIG. 17 is a view for explaining a mesa-type semiconductor element 200 of a modification.

A resin-sealed semiconductor device 14 of the modification (not shown in the drawing) basically has the substantially same constitution as the resin-sealed semiconductor device 10 of the embodiment 1. However, the resin-sealed semiconductor device 14 of the modification differs from the resin-sealed semiconductor device 10 of the embodiment 1 with respect to a point that the resin-sealed semiconductor device 14 uses a mesa-type semiconductor element constituted of a thyristor.

That is, the resin-sealed semiconductor device 14 of the modification includes: a mesa-type semiconductor element 200 which includes a mesa-type semiconductor base body having a pn-junction exposure portion in an outer peripheral tapered region surrounding a mesa region, and a glass layer 224 which covers at least the outer peripheral tapered region; and a molding resin which seals the mesa-type semiconductor element 200, wherein the mesa-type semiconductor element 200 includes a glass layer which substantially contains no Pb as the glass layer 224.

The mesa-type semiconductor element 200 of the modification is formed of a thyristor. As shown in FIG. 17, the mesa-type semiconductor element 200 includes: an $n^-$-type semiconductor layer 210; a first $p^+$-type semiconductor layer 212 which is arranged in a state where the first $p^+$-type semiconductor layer 212 is brought into contact with the $n^-$-type semiconductor layer 210; a second $p^+$-type semiconductor layer 214 which is arranged in a state where the second $p^+$-type semiconductor layer 214 is brought into contact with the $n^-$-type semiconductor layer 210; an $n^+$-type semiconductor region 216 which is formed on a surface of the second $p^+$-type semiconductor layer 214; an anode electrode 234 which is connected to the first $p^+$-type semiconductor layer 212; a cathode electrode 236 which is connected to the $n^+$-type semiconductor region 216, and a gate electrode 238 which is connected to the second $p^+$-type semiconductor layer 214.

As described above, the resin-sealed semiconductor device 14 of the modification differs from the resin-sealed semiconductor device 10 of the embodiment 1 with respect to a point that the resin-sealed semiconductor device 14 uses the mesa-type semiconductor element formed of a thyristor. However, in the same manner as the resin-sealed semiconductor device 10 of the embodiment 1, the mesa-type semiconductor element includes a glass layer made of lead-free glass (glass which contains no Pb) having a lower dielectric constant than lead-containing glass as the glass layer. Accordingly, the resin-sealed semiconductor device of the modification can acquire higher resistance to a reverse bias at a high temperature than the conventional resin-sealed semiconductor device in the same manner as the resin-sealed semiconductor device 10 of the embodiment 1, although the resin-sealed semiconductor device of the modification has the structure where the mesa-type semiconductor element is molded with a resin in the same manner as the conventional resin-sealed semiconductor device. That is, the resin-sealed semiconductor device 14 of the modification is the resin-sealed semiconductor device having higher resistance to a reverse bias at a high temperature than the conventional resin-sealed semiconductor device while being the resin-sealed semiconductor device which is manufactured by molding the mesa-type semiconductor element with a resin.

According to the resin-sealed semiconductor device 14 of the modification, the glass layer is formed by baking the layer made of the glass composition for protecting a semiconductor junction which is made of fine glass particles prepared from a material in a molten state obtained by melting a raw material which contains at least $SiO_2$, $Al_2O_2$, $B_2O_3$, ZnO, at least two oxides of alkaline earth metals selected from a group consisting of CaO, BaO and MgO, wherein the contents of the respective components are set as described above. Accordingly, in the same manner as the resin-sealed semiconductor device 10 of the embodiment 1, it is possible to set an average linear expansion coefficient within a temperature range of 50° C. to 550° C. to a linear expansion coefficient (for example, $3.33\times10^{-6}$ to $4.13\times10^{-6}$) close to a linear expansion coefficient of silicon. Accordingly, warping of a wafer in a step can be made extremely small and hence, a resin-sealed semiconductor device having an excellent forward breakdown voltage characteristic can be manufactured using a thin wafer and, at the same time, a resin-sealed semiconductor device having an excellent reverse breakdown voltage characteristic can be manufactured by increasing a thickness of the glass layer.

According to the resin-sealed semiconductor device 14 of the modification, the glass layer is formed by baking the layer made of the glass composition for protecting a semiconductor junction which is made of fine glass particles prepared from a material in a molten state obtained by melting a raw material which contains at least $SiO_2$, $Al_2O_3$, $B_2O_3$, ZnO, at least two oxides of alkaline earth metals selected from a group consisting of CaO, BaO and MgO, contents of the respective components being set as described above. Accordingly, in the same manner as the resin-sealed semiconductor device 10 of the embodiment 1, the glass layer can be baked at a relatively low temperature and hence, crystallization of the glass layer is hardly generated in the step of baking the glass layer. Also because of such an advantageous effect, a resin-sealed semiconductor device having a low reverse leakage current and eventually having high resistance to a reverse bias at a high temperature can be manufactured in a stable manner.

According to the resin-sealed semiconductor device 14 of the modification, the glass layer is formed by baking the layer made of the glass composition for protecting a semiconductor junction which contains none of components of the raw material as a filler. Accordingly, in the same manner as the resin-sealed semiconductor device 10 of the embodiment 1, the layer made of the glass composition for protecting a semiconductor junction can be uniformly formed at the time of forming the layer made of the glass composition for protecting a semiconductor junction such that the layer covers an inner surface of a trench.

(2) In the above-mentioned embodiment 2, an insulation layer is formed by a thermal oxidation method using dry oxygen ($DryO_2$). However, the present invention is not limited to such an insulation layer. For example, an insulation layer may be formed by a thermal oxidation method using dry oxygen and nitrogen ($DryO_2+N_2$), an insulation layer may be formed by a thermal oxidation method using wet oxygen ($WetO_2$), or an insulation layer may be formed by a thermal oxidation method using wet oxygen and nitrogen ($WetO_2+N_2$). Further, an insulation layer formed of a silicon oxide film may be formed by CVD. Moreover, an insulation layer formed of a film other than a silicon oxide film (for example, an insulation layer formed of a silicon nitride film) may be formed.

(3) In the above-mentioned respective embodiments, a photomask is used as a mask in etching the oxide film 116b. However, the present invention is not limited to the photomask. For example, a pitch-based glass protecting film may be used.

(4) In the above-mentioned respective embodiments, the layer made of the glass composition for protecting a semiconductor junction is formed by an electrophoresis method. However, the present invention is not limited to such a method. For example, the layer made of the glass composition for protecting a semiconductor junction may be formed by a spin coating method, a screen printing method, a doctor blade method or other glass layer forming methods. In this case, as the glass composition for protecting a semiconductor junction, it is preferable to use a glass composition for protecting a semiconductor junction which is obtained by adding an organic binder to the glass composition for protecting a semiconductor junction used in the embodiment 1.

(5) In the semiconductor device and the method of manufacturing the semiconductor device of the present invention, it is preferable to use the glass composition which is hardly crystallized in a process of baking the glass composition layer. With the use of such glass composition, it is possible to manufacture a semiconductor device having a low reverse leakage current in a stable manner. In this respect, the present invention differs from the technique disclosed in JP-A-63-117929 where the glass composition is converted into a glass ceramic body having high degree of crystallinity in the process of baking a glass layer.

(6) In the semiconductor device and the method of manufacturing the semiconductor device of the present invention, it is preferable to use a raw material which substantially contains no Bi. With the use of such a raw material, the glass layer is hardly crystallized in the process of baking the glass composition layer so that a semiconductor device having a low reverse leakage current can be manufactured in a stable manner. In this respect, the present invention differs from the technique disclosed in JP-T-2005-525287 where a raw material which contains Bi is used.

(7) In the semiconductor device and the method of manufacturing the semiconductor device of the present invention, it is preferable to use a raw material which substantially contains no Cu. With the use of such a raw material, the glass layer is hardly crystallized in the process of baking the glass composition layer. Also with the use of such a raw material, it is possible to manufacture a semiconductor device having a low reverse leakage current in a stable manner. In this respect, the present invention differs from the technique disclosed in JP-A-2001-287984 where a raw material which contains Cu is used.

(8) In the semiconductor device and the method of manufacturing the semiconductor device of the present invention, a raw material which substantially contains neither Li nor Pb is used. In this respect, the present invention differs from the technique disclosed in JP-A-2002-16272 where a raw material containing Li and Pb is used.

Patent literature JP-A-53-36463 discloses a technique where zinc-based glass (glass which exhibits the highest content of zinc oxide among glasses containing zinc oxide) is used as the glass layer for passivation. However, zinc-based glass has low resistance to chemicals (see comparison example 2 of an embodiment of the above-mentioned patent literature JP-A-53-36463) and hence, zinc-based glass cannot be simply used in the present invention.

(10) In the semiconductor device and the method of manufacturing the semiconductor device of the present invention, it is preferable to use a raw material which substantially contains no P. With the use of such a raw material, it is possible to prevent the diffusion of P (phosphorous) into the semiconductor base body from the glass layer in the process of baking the glass composition layer and hence, a highly reliable semiconductor device can be manufactured.

EXPLANATION OF SYMBOLS

10: resin-sealed semiconductor device
20: lead frame
21, 22: lead
23: die pad
30: Al wire
40: resin
100, 102, 200: mesa-type semiconductor element
110, 910: $n^-$-type semiconductor layer
112, 912: $p^+$-type semiconductor layer
114, 914: $n^+$-type diffusion layer
116, 118, 916, 918: oxide film
120, 920: trench
121: insulation film
124, 924: glass layer
126, 926: photoresist
130, 930: position where Ni plating electrode film is to be formed
132, 932: roughened surface region
134, 234, 934, 234: anode electrode layer
136, 236, 936: cathode electrode layer 210: n⁻-type semiconductor layer
212: first p⁺-type semiconductor layer
214: second p⁺-type semiconductor layer
216: n⁺-type semiconductor region
238: gate electrode layer

The invention claimed is:

1. A resin-sealed semiconductor device comprising:
a mesa-type semiconductor element which includes a mesa-type semiconductor base body having a pn-junction exposure portion in an outer peripheral tapered region which surrounds a mesa region, and a glass layer which covers at least the outer peripheral tapered region; and
a molding resin which seals the mesa-type semiconductor element, wherein
the glass layer is formed by forming a layer made of a glass composition for protecting a semiconductor junction such that the layer covers the outer peripheral tapered region and, subsequently, by baking the layer made of the glass composition for protecting a semiconductor junction, wherein
the glass composition for protecting a semiconductor junction is made of fine glass particles prepared from a material in a molten state obtained by melting a raw material which contains at least nickel oxide, $SiO_2$, $Al_2O_3$, $B_2O_3$, ZnO, CaO, BaO and MgO, contents of the respective components being set as described below, substantially contains none of Pb, As, Sb, Li, Na and K, and contains none of the components of the raw material as a filler, and
the content of $SiO_2$: 49.5 mol % to 64.3 mol %
the content of $Al_2O_3$: 3.7 mol % to 14.8 mol %
the content of $B_2O_3$: 8.4 mol % to 17.9 mol %
the content of ZnO: 3.9 mol % to 14.2 mol %
the content of oxides of alkaline earth metals: 7.4 mol % to 12.9 mol %,
wherein
the content of BaO falls within a range of 2.6 mol % to 5.3 mol %.

2. The resin-sealed semiconductor device according to claim 1, wherein the glass composition for protecting a semiconductor junction is a glass composition for protecting a semiconductor junction where an average linear expansion coefficient within a temperature range of 50° C. to 550° C. of the glass composition for protecting a semiconductor junction falls within a range of $3.33 \times 10^{-6} K^{-1}$ to $4.13 \times 10^{-6} K^{-1}$.

3. The resin-sealed semiconductor device according to claim 2, wherein the glass composition for protecting a semiconductor junction is a glass composition for protecting a semiconductor junction where a total content of the content of $SiO_2$ and the content of $B_2O_3$ falls within a range of 65 mol % to 75 mol %.

4. The resin-sealed semiconductor device according to claim 1, wherein the raw material substantially contains no P.

5. The resin-sealed semiconductor device according to claim 1, wherein the raw material substantially contains no Bi.

6. The resin-sealed semiconductor device according to claim 1, wherein the glass layer is formed by baking a layer made of the glass composition for protecting a semiconductor junction at a temperature of 900° C. or below.

7. The resin-sealed semiconductor device according to claim 1, wherein the outer peripheral tapered region is directly covered with the glass layer.

8. The resin-sealed semiconductor device according to claim 1, wherein the outer peripheral tapered region is covered with the glass layer with an insulation layer interposed between the outer peripheral tapered region and the glass layer.

9. The resin-sealed semiconductor device according to claim 8, wherein the glass composition for protecting a semiconductor junction is a glass composition for protecting a semiconductor junction which substantially contains no multivalent element as a defoaming agent.

10. The resin-sealed semiconductor device according to claim 9, wherein the multivalent element contains V, Mn, Sn, Ce, Nb and Ta.

11. A method of manufacturing a resin-sealed semiconductor device, the method comprising, in the following order, the steps of:
preparing a semiconductor substrate provided with a pn-junction parallel to a main surface;
forming a trench from one surface of the semiconductor substrate with a depth exceeding the pn junction;
forming a glass layer by forming a layer made of a glass composition for protecting a semiconductor junction such that the layer covers at least an inner surface of the trench and, subsequently, by baking the layer made of the glass composition for protecting a semiconductor junction;
preparing mesa-type semiconductor elements by cutting the semiconductor substrate along the trench; and
sealing the mesa-type semiconductor element with a molding resin, wherein
the glass composition for protecting a semiconductor junction is made of fine glass particles prepared from a material in a molten state obtained by melting a raw material which contains at least nickel oxide, $SiO_2$, $Al_2O_3$, $B_2O_3$, ZnO and at least two oxides of alkaline earth metals selected from a group consisting of CaO, BaO and MgO, the contents of the respective components being set as described below, and substantially contains none of Pb, As, Sb, Li, Na and K, and contains none of the components of the raw material as a filler, and
the content of $SiO_2$: 49.5 mol % to 64.3 mol %
the content of $Al_2O_3$: 3.7 mol % to 14.8 mol %
the content of $B_2O_3$: 8.4 mol % to 17.9 mol %
the content of ZnO: 3.9 mol % to 14.2 mol %
the content of oxides of alkaline earth metals 7.4 mol % to 12.9 mol %.

12. A resin-sealed semiconductor device comprising:
a mesa-type semiconductor element which includes a mesa-type semiconductor base body having a pn-junction exposure portion in an outer peripheral tapered region which surrounds a mesa region, and a glass layer which covers at least the outer peripheral tapered region; and
a molding resin which seals the mesa-type semiconductor element, wherein the glass layer is formed by forming a layer made of a glass composition for protecting a semiconductor junction such that the layer covers the outer peripheral tapered region and, subsequently, by baking the layer made of the glass composition for protecting a semiconductor junction, wherein
the glass composition for protecting a semiconductor junction is made of fine glass particles prepared from a material in a molten state obtained by melting a raw material which contains at least nickel oxide, $SiO_2$, $Al_2O_3$, $B_2O_3$, ZnO, CaO, and BaO, contents of the respective components being set as described below, substantially contains none of Pb, As, Sb, Li, Na and K, and contains none of the components of the raw material as a filler, and the content of $SiO_2$: 49.5 mol % to 64.3 mol %
the content of $Al_2O_3$: 3.7 mol % to 14.8 mol %
the content of $B_2O_3$: 8.4 mol % to 17.9 mol %
the content of ZnO: 3.9 mol % to 14.2 mol %
the content of oxides of alkaline earth metals: 7.4 mol % to 12.9 mol %, wherein the content of BaO falls within a range of 3.7 mol % to 5.9 mol %.

* * * * *